US009117942B2

(12) United States Patent
Miyamoto et al.

(10) Patent No.: US 9,117,942 B2
(45) Date of Patent: Aug. 25, 2015

(54) ELECTRONIC DEVICE AND ELECTRONIC DEVICE MANUFACTURING METHOD

(71) Applicant: PANASONIC CORPORATION, Osaka (JP)

(72) Inventors: Akihito Miyamoto, Osaka (JP); Yuko Okumoto, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 14/551,540

(22) Filed: Nov. 24, 2014

(65) Prior Publication Data

US 2015/0102333 A1    Apr. 16, 2015

Related U.S. Application Data

(63) Continuation of application No. PCT/JP2014/001721, filed on Mar. 25, 2014.

(30) Foreign Application Priority Data

Mar. 26, 2013   (JP) ................................. 2013-063849

(51) Int. Cl.
*H01L 29/08*   (2006.01)
*H01L 21/00*   (2006.01)
(Continued)

(52) U.S. Cl.
CPC ............ *H01L 33/005* (2013.01); *H01L 29/786* (2013.01); *H01L 33/0041* (2013.01);
(Continued)

(58) Field of Classification Search
CPC ............ H01L 51/0036; H01L 51/0545; H01L 51/5088; H01L 27/3246

USPC .............................. 257/40, 88, 99; 438/22, 99
See application file for complete search history.

(56) References Cited

U.S. PATENT DOCUMENTS 8,212,267 B2 *  7/2012  Oosako .......................... 257/88
8,796,692 B2    8/2014  Kanegae et al.
(Continued)

FOREIGN PATENT DOCUMENTS

JP    2007-088471    4/2007
JP    2008-205284    9/2008
JP    2009-076791    4/2009

OTHER PUBLICATIONS

U.S. Appl. No. 14/551,564 to Akihito Miyamoto et al., filed Nov. 24, 2014.

(Continued)

*Primary Examiner* — Nicholas Tobergte
(74) *Attorney, Agent, or Firm* — Greenblum & Bernstein, P.L.C.

(57) ABSTRACT

An electronic device including: a substrate; a bank formed above the substrate; a semiconductor layer formed within an aperture surrounded by the bank; and electrodes electrically connected to the semiconductor layer. An outline of the aperture in plan view includes a first straight edge, a second straight edge continuous with one end of the first edge via a first connector, and a straight third edge continuous with the other end of the first edge via a second connector. The area of a first connector region differs from the area of a second connector region, the first connector region being defined by a first imaginary straight line along the first edge, a second imaginary straight line along the second edge, and the first connector, and the second connector region being defined by a third imaginary straight line along the third edge, the first imaginary straight line, and the second connector.

17 Claims, 17 Drawing Sheets

(51) Int. Cl.
*H01L 51/40* (2006.01)
*H01L 33/00* (2010.01)
*H01L 29/786* (2006.01)
*H01L 33/36* (2010.01)
*H01L 51/00* (2006.01)
*H01L 51/52* (2006.01)
*H01L 51/56* (2006.01)
*H01L 51/05* (2006.01)
*H01L 51/10* (2006.01)

(52) U.S. Cl.
CPC ............ *H01L33/36* (2013.01); *H01L 51/0004* (2013.01); *H01L 51/0021* (2013.01); *H01L 51/0558* (2013.01); *H01L 51/105* (2013.01); *H01L 51/5203* (2013.01); *H01L 51/56* (2013.01); *H01L 51/0545* (2013.01); *H01L 51/5296* (2013.01); *H01L 2933/0016* (2013.01); *Y02B 20/343* (2013.01)

(56) References Cited

U.S. PATENT DOCUMENTS

| | | | |
|---|---|---|---|
| 9,000,475 B2* | 4/2015 | Sekimoto | 257/99 |
| 2007/0166855 A1 | 7/2007 | Lee et al. | |
| 2009/0215350 A1* | 8/2009 | Takei et al. | 445/23 |
| 2011/0108859 A1* | 5/2011 | Oosako | 257/88 |
| 2013/0320388 A1* | 12/2013 | Sekimoto | 257/99 |
| 2014/0367669 A1* | 12/2014 | Takeuchi et al. | 257/40 |

OTHER PUBLICATIONS

International Search Report (ISR) in International Patent Application No. PCT/JP2014/001721, dated Jul. 8, 2014.

* cited by examiner

100

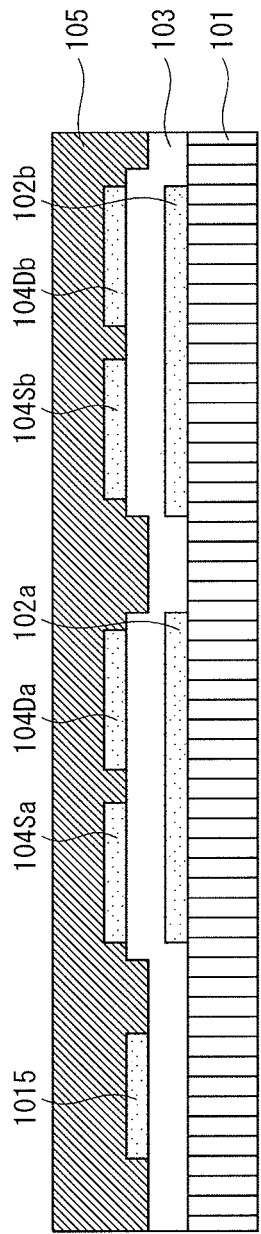
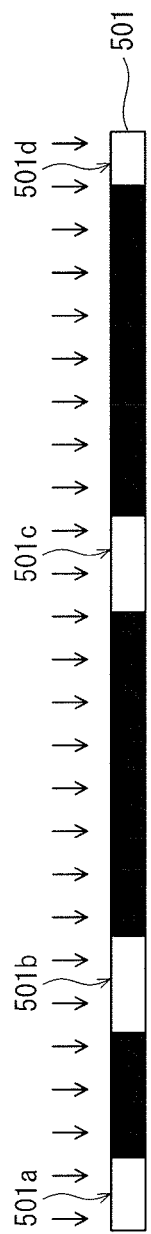
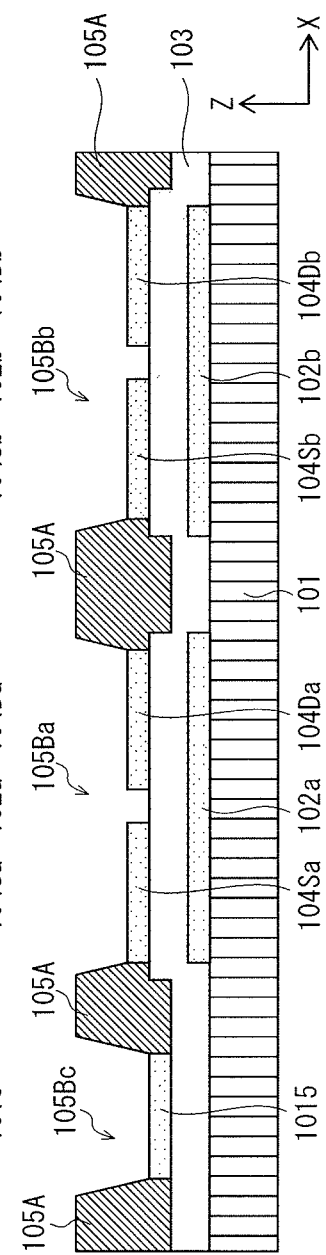
FIG. 5A
FIG. 5B
FIG. 5C

900

ELECTRONIC DEVICE AND ELECTRONIC DEVICE MANUFACTURING METHOD

CROSS REFERENCE TO RELATED APPLICATION

This is a continuation application of PCT Application No. PCT/JP2014/001721 filed on Mar. 25, 2014, designating the United States of America, the disclosure of which, including the specification, drawings and claims, is incorporated herein by reference in its entirety.

TECHNICAL FIELD

The present disclosure relates to an electronic device and an electronic device manufacturing method, and in particular to reduction of variations in the properties of a semiconductor layer formed by a coating method.

BACKGROUND ART

In recent years, electronic devices having a semiconductor layer, such as a thin-film transistor (TFT), a photo sensor and a light-emitting element, have been used in various products. Specific products using such an electronic device are, for example, active matrix drive display devices such as liquid crystal display devices and organic electroluminescence (EL) display devices. In an active matrix drive display device, TFTs are used as the electronic devices.

In display device products, TFTs in which a silicon layer is used as a semiconductor layer are commonly used. In recent years, however, more attention has been paid to coating-type TFTs in which an organic material layer is used as a semiconductor layer. Unlike silicon crystals bonded by atomic bonding, organic materials are bonded by intermolecular forces, and hence organic materials are flexible. Therefore, by using TFTs in which an organic material layer is used as a semiconductor layer, it is possible to realize lighter and thinner electronic devices compared to electronic devices using TFTs in which a silicon layer is used as a semiconductor layer. Such a configuration also provides flexibility to the electronic devices. For this reason, there is a proposal to use such coating-type TFTs in next-generation display devices, electronic paper, and so on.

As examples of coating-type TFTs, bottom gate type organic TFTs are known. FIG. 14 is a cross-sectional view illustrating a configuration of a conventional TFT 900. As shown in FIG. 14, the conventional TFT 900 includes a substrate 901 and the following components sequentially formed on the substrate 901: a gate electrode 902; a gate insulation layer 903; a source electrode 904S and a drain electrode 904D as a pair of electrodes; a bank 905A having an aperture 905B located above the gate electrode 902; and a semiconductor layer 907 located within the aperture 905B of the bank 905A. Furthermore, a protective film 908 is formed on the semiconductor layer 907.

Patent Literature 1 discloses forming a semiconductor layer by a coating method.

CITATION LIST

Patent Literature

[Patent Literature 1] Japanese Patent Application Publication No. 2009-76791

SUMMARY

Technical Problem

However, it has been found that, in the conventional TFT 900, when the semiconductor layer 907 is formed within the aperture 905B by a coating method, the film thickness of the semiconductor layer 907 is likely to vary, and such variations of the film thickness result in variations in the properties of the transistor. In particular, the variations of the film thickness of the semiconductor layer 907 are particularly noticeable near the inner edges of the aperture 905B, where the semiconductor layer 907 climbs the lateral surface of the bank 905A surrounding the aperture 905B.

The present disclosure is provided in view of the above-described problem, and aims to provide an electronic device in which variations in the properties of the semiconductor layer formed by a coating method are reduced, and to provide a method of manufacturing such an electronic device.

Solution to Problem

One aspect of the present invention is an electronic device comprising: a substrate; a bank formed above the substrate; a semiconductor layer formed within an aperture surrounded by the bank; and a pair of electrodes electrically connected to the semiconductor layer, wherein an outline of the aperture in plan view includes a first edge that is a straight line segment, a second edge that is a straight line segment continuous with one end of the first edge via a first connector, and a third edge that is a straight line segment continuous with the other end of the first edge via a second connector, and the area of a first connector region differs from the area of a second connector region, the first connector region being defined by a first imaginary straight line extending along the first edge, a second imaginary straight line extending along the second edge, and the first connector, and the second connector region being defined by a third imaginary straight line extending along the third edge, the first imaginary straight line, and the second connector.

Effects

In the electronic device pertaining to one aspect of the present invention, the area of the first connector region differs from the area of the second connector region. For example, when at least one of the first connector and the second connector is shifted toward the center of the aperture, i.e. when the first connector has a sharper shape than the second connector, the second connector region has a greater area than the first connector region. Therefore, in the semiconductor ink applied within the aperture, a portion located near the first edge of the aperture is likely to flow from the second connector to the first connector, while drying. Thus, the stated configuration makes it easy to control the flow of the semiconductor ink, from the second connector to the first connector. Since the area of the first connector region differs from the area of the second connector region, the stated configuration reduces the variations of the film thickness of the semiconductor layer caused by progression of the drying of the semiconductor ink in random directions. Accordingly, the electronic device having the stated configuration exhibits smaller variations in the semiconductor properties than in conventional devices.

BRIEF DESCRIPTION OF DRAWINGS

FIG. 4A is a schematic cross-sectional view illustrating a situation in which a gate electrode is formed on a substrate, FIG. 4B is a schematic cross-sectional view illustrating a situation in which a gate insulation layer is formed on the substrate and the gate electrode, and FIG. 4C is a schematic cross-sectional view illustrating a situation in which a source electrode, a drain electrode and connection wiring are formed on the gate insulation layer.

FIGS. 5A through 5C are schematic cross-sectional views illustrating part of the process of manufacturing the TFT continued from FIG. 4C, where FIG. 5A is a schematic cross-sectional view illustrating a situation in which a photo-sensitive resist material film is formed on the gate insulation layer, the source electrode, the drain electrode and the connection wiring, FIG. 5B is a schematic cross-sectional view illustrating a situation in which the photo-sensitive resist material film is exposed to light with a mask placed above the photo-resist material film, and FIG. 5C is a schematic cross-sectional view illustrating a situation in which a bank is formed.

FIG. 6A is a schematic cross-sectional view illustrating a situation in which a semiconductor layer is formed on the source electrode, the drain electrode, and the gate insulation layer, within the aperture of the bank, and FIG. 6B is a schematic cross-sectional view illustrating a situation in which a passivation film is formed on the semiconductor layer and the bank.

DESCRIPTION OF EMBODIMENTS

Figure 1:
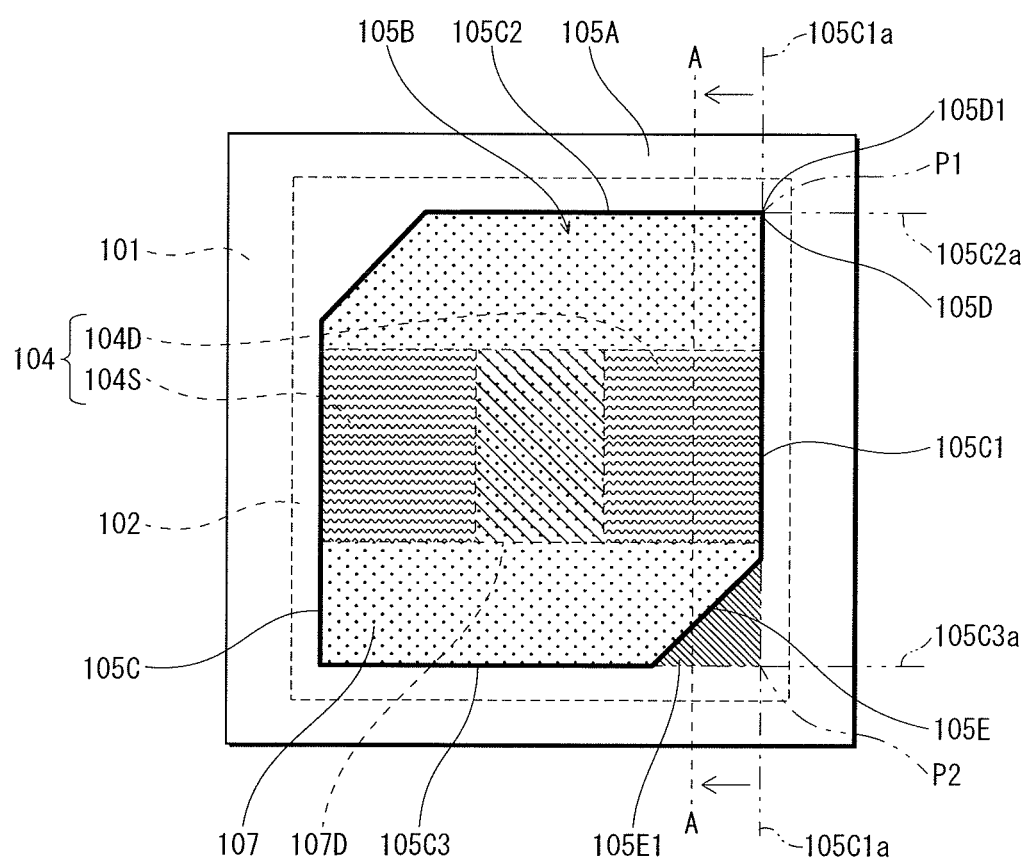
FIG. 1 is a schematic top view illustrating a thin-film transistor (TFT) pertaining to Embodiment 1.

Outline of an Aspect of the Present Invention

One aspect of the present invention is an electronic device comprising: a substrate; a bank formed above the substrate; a semiconductor layer formed within an aperture surrounded by the bank; and a pair of electrodes electrically connected to the semiconductor layer, wherein an outline of the aperture in plan view includes a first edge that is a straight line segment, a second edge that is a straight line segment continuous with one end of the first edge via a first connector, and a third edge that is a straight line segment continuous with the other end of the first edge via a second connector, and the area of a first connector region differs from the area of a second connector region, the first connector region being defined by a first imaginary straight line extending along the first edge, a second imaginary straight line extending along the second edge, and the first connector, and the second connector region being defined by a third imaginary straight line extending along the third edge, the first imaginary straight line, and the second connector.

As the area of the first connector region differs from the area of the second connector region, the degree of shifting of the first connector toward the center of the aperture differs from the degree of shifting of the second connector toward the same. Therefore, during the drying of the semiconductor ink applied within the aperture, the semiconductor ink near the first edge is likely to flow from one of the second connector and the first connector that is shifted toward the center of the aperture by a greater amount than the other connector, toward the other connector that is shifted toward the center of the aperture by a smaller amount. Thus, the stated configuration is likely to form a flow of the semiconductor ink. As a result, the stated configuration reduces the variations of the film thickness of the semiconductor layer caused by progression of the drying of the semiconductor ink in random directions, thereby reducing the variations in the semiconductor properties.

The first connector may be a straight line segment.

Since the first connector has a simple straight shape, manufacturing of the mask used for forming the aperture is easy.

The first connector may be a curved line segment.

Since the first connector is curved, it is unlikely that a gap occurs between the semiconductor layer and the first connector.

The second connector may be a straight line segment.

Since the second connector has a simple straight shape, manufacturing of the mask used for forming the aperture is easy.

The second connector may be a curved line segment.

Since the second connector is curved, it is unlikely that a gap occurs between the semiconductor layer and the second connector.

In plan view, a portion of the semiconductor layer between the pair of electrodes may be separated from the outline.

On the lateral surface of the bank surrounding the aperture, which can be depicted as the outline of the aperture in plan view, the semiconductor layer is likely to have a large film thickness due to the phenomenon in which the applied semiconductor ink climbs the lateral surface. Since the channel area of the semiconductor layer, which is the area between the pair of electrodes, is separated from the area in which the semiconductor layer is likely to have a large film thickness, the stated configuration prevents the influence of the large film thickness upon the semiconductor properties.

A first intersection point, being an intersection of the first imaginary straight line and the second imaginary straight line, may be located in the first connector or outside the outline, a second intersection point, being an intersection of the third imaginary straight line and the first imaginary straight line, may be located outside the outline, and the area of the second connector region may be greater than the area of the first connector region.

In other words, neither the first connector nor the second connector is located outside the imaginary straight line extending along the first edge, and the second connector is shifted further toward the center of the aperture than the first connector. Therefore, during the drying of the semiconductor ink applied within the aperture, the semiconductor ink near the first edge is likely to flow from the second connector toward the first connector. Thus, the stated configuration is likely to form a flow of the semiconductor ink. As a result, the stated configuration reduces the variations of the film thickness of the semiconductor layer caused by progression of the drying of the semiconductor ink in random directions, thereby reducing the variations in the semiconductor properties.

In plan view, a portion of the semiconductor layer between the pair of electrodes may be separated from the first connector.

Since the channel area of the semiconductor layer, which is the area between the pair of electrodes, is separated from the first connector where the semiconductor layer is likely to have a large film thickness, the stated configuration prevents the influence of the large film thickness upon the semiconductor properties even when such a thick portion occurs near the first connector.

In plan view, the pair of electrodes may be located so as not to overlap the first connector.

The surfaces of the electrode have a relatively high degree of wettability to the semiconductor ink, and the semiconductor ink is likely to gather on the surfaces of the electrodes. Accordingly, portions of the semiconductor layer located above the electrodes are likely to have a large film thickness. Since the electrodes do not overlap the first connector in plan view, the semiconductor ink is likely to flow toward the first connector. Therefore, the stated configuration realizes a semiconductor layer with a relatively uniform thickness, and reduces the variations in the semiconductor properties.

In plan view, at least one of the pair of electrodes may be located so as to overlap the first connector.

According to this configuration, even when the semiconductor layer has a large film thickness near the first connector, the channel area is not located near the first connector. Therefore, this configuration prevents the influence of the large film thickness upon the semiconductor properties.

The outline of the aperture in plan view may additionally include a fourth edge that is a straight line segment continuous with one end of the third edge via a third connector and with one end of the second edge via a fourth connector, said one end of the third edge being not connected to the second connector, and said one end of the second edge being not connected to the first connector, the area of a third connector region may differ from the area of the second connector region, the third connector region being defined by a fourth imaginary straight line extending along the fourth edge, the third imaginary straight line, and the third connector, and the area of a fourth connector region may differ from the area of the third connector region and the area of the first connector region, the fourth connector region being defined by the fourth imaginary straight line, the second imaginary straight line, and the fourth connector.

In other words, every one of the first to fourth edge has a connector that is shifted further toward the center of the aperture than the other connector. Therefore, during the drying of the semiconductor ink applied within the aperture, the semiconductor ink near every one of the edges is likely to flow toward one of the connectors to which the edge is connected. Consequently, the variations of the film thickness of the semiconductor layer are reduced near every edge.

The semiconductor layer may contain a material that performs photoelectric conversion.

The stated configuration realizes a photoelectric conversion element with excellent properties as an example of an electronic device pertaining to one aspect of the present invention.

The pair of electrodes may be formed above and below the semiconductor layer, with the semiconductor layer interposed therebetween, and the semiconductor layer may contain an organic or inorganic light-emitting material.

The stated configuration realizes a light-emitting element with excellent properties as an example of electronic device pertaining to one aspect of the present invention.

The electronic device may further comprise a gate electrode formed between the substrate and the semiconductor layer, wherein the pair of electrodes may be formed along a main surface of the substrate, with an interval therebetween, and a portion of the semiconductor layer may be formed between the pair of electrodes, the pair of electrodes being composed of a source electrode and a drain electrode.

The stated configuration realizes a thin-film transistor with excellent properties as an example of electronic device pertaining to one aspect of the present invention.

Another aspect of the present invention is an electronic device manufacturing method comprising: preparing a substrate; forming a bank above the substrate; applying ink within an aperture surrounded by the bank, thereby forming a semiconductor layer, the ink containing a semiconductor material; and forming a pair of electrodes electrically connected to the semiconductor layer, wherein an outline of the aperture in plan view includes a first edge that is a straight line segment, a second edge that is a straight line segment continuous with one end of the first edge via a first connector, and a third edge that is a straight line segment continuous with the other end of the first edge via a second connector, and the area of a first connector region differs from the area of a second connector region, the first connector region being defined by a first imaginary straight line extending along the first edge, a second imaginary straight line extending along the second edge, and the first connector, and the second connector region being defined by a third imaginary straight line extending along the third edge, the first imaginary straight line, and the second connector.

During the drying of the semiconductor ink applied within the aperture, the semiconductor ink near the first edge is likely to flow from one of the second connector and the first connector that has a larger connector region and that is shifted toward the center of the aperture by a greater amount than the other connector, toward the other connector that has a smaller connector region and that is shifted toward the center of the aperture by a smaller amount. Thus, the stated configuration is likely to form a flow of the semiconductor ink. Therefore, the stated configuration reduces the variations of the film thickness of the semiconductor layer caused by progression of the drying of the semiconductor ink in random directions, thereby reducing the variations in the semiconductor properties. Thus, the stated configuration realizes manufacturing of an electronic device with excellent semiconductor properties.

The ink may contain an organic or inorganic light-emitting material, and the pair of electrodes may be formed above the substrate and above and below the semiconductor layer, with the semiconductor layer interposed between the pair of electrodes.

The stated configuration realizes formation of a light-emitting element with excellent properties.

The electronic device manufacturing method may further comprise: forming another electrode on the substrate; and forming an insulation layer between the semiconductor layer and the pair of electrodes, wherein the pair of electrodes are formed along a main surface of the substrate, with an interval therebetween, and a portion of the semiconductor layer is formed between the pair of electrodes.

The stated configuration realizes formation of a thin-film transistor with excellent properties.

<Background Leading to One Aspect of Present Invention>

First, the following describes the background leading to one aspect of the present invention.

As a result of intense study, the inventors discovered the cause of the variations in the properties of a conventional thin-film transistor (TFT), and conceived of the present disclosure.

Figure 15:
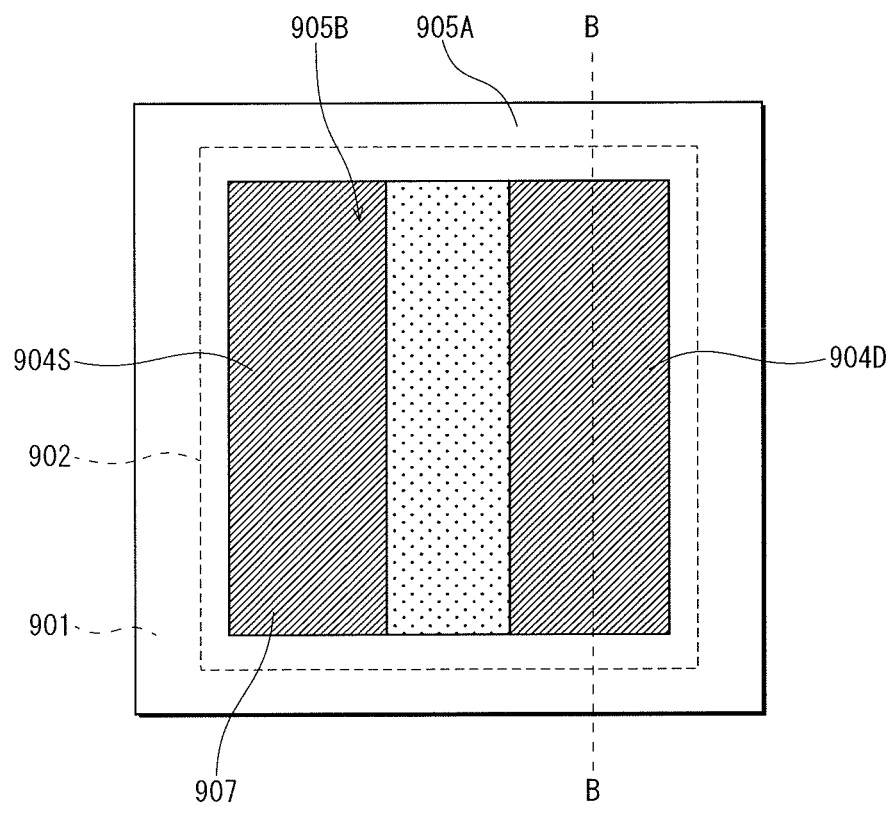
FIG. 15 is a schematic top view illustrating a conventional TFT.

FIG. 15 is a schematic top view illustrating a conventional TFT 900. As shown in FIG. 15, in the TFT 900, an aperture 905B is defined above a gate electrode 902. Within the aperture 905B, a source electrode 904S and a drain electrode 904D are located along inner edges of the aperture 905B respectively, so as to be separated from each other. The semiconductor layer 907 is formed by applying a semiconductor ink within the aperture 905B and drying the ink.

The inventors observed that, when forming the semiconductor layer 907 by dripping the semiconductor ink within the aperture 905B, the film thickness of the semiconductor layer 907 was significantly uneven near the inner edges of the aperture 905B. It was also observed that the semiconductor ink climbed the inner walls of the bank 905A, and consequently the semiconductor layer 907 had a larger film thickness near the inner edges of the aperture 905B than in the central area of the aperture 905B.

Figure 16:
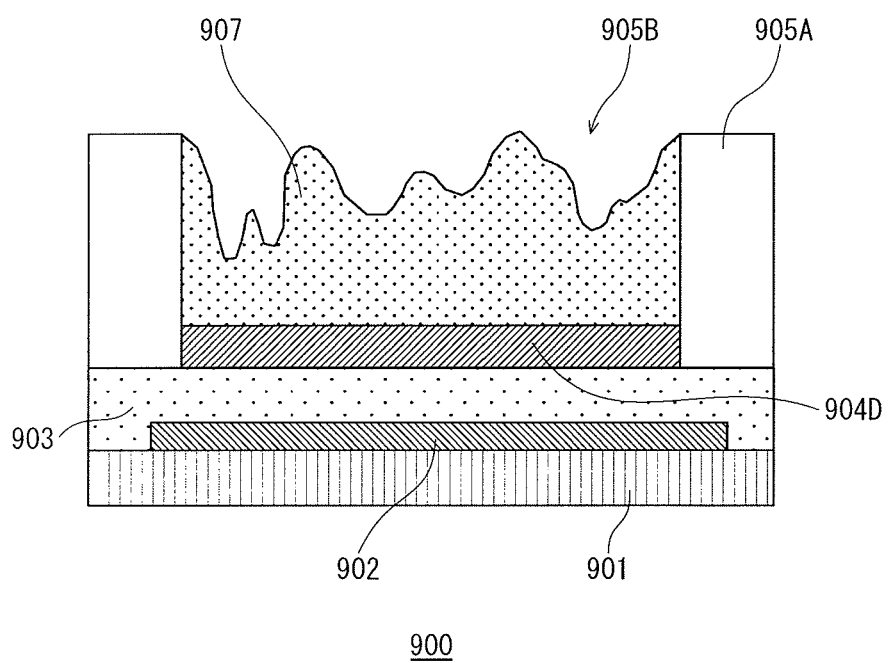
FIG. 16 is a schematic cross-sectional view illustrating a conventional TFT.

FIG. 16 illustrates a cross-sectional view of the TFT 900 along the dotted line B-B shown in FIG. 15. The gate electrode 902 and the gate insulation layer 903 are disposed on the substrate 901. The bank 905A is formed on the gate insulation layer 903 so as to define the aperture 905B above the gate electrode 902. The semiconductor layer 907 and the drain electrode 904D electrically connected to the semiconductor layer 907 are disposed within the aperture 905B.

The variations of the film thickness of the semiconductor layer 907 were found near the inner edges of the aperture 905B. Due to local variations of the film thickness of the semiconductor layer 907 near the inner edges of the aperture 905B, the entire semiconductor layer 907 formed within the aperture 905B was uneven.

Such unevenness of the semiconductor layer 907 has adverse effects on the properties of the TFT. For example, the quality of the crystals differs in a thick portion and in a thin portion of the semiconductor layer 907 (Generally, the diameter of the crystal particles in a thick portion is smaller than in a thin portion). Furthermore, a hump phenomenon or variations in the properties of the TFT occur.

As a result of intense study, the inventors found that the variations of the thickness of the semiconductor layer 907 near the inner edges of the aperture 905B are related to the fact that, near the inner edges of the aperture 905B, the interface between the portion of the ink in the liquid phase and the portion of the ink in the solid phase, from which the ink gradually dries, progresses in random directions. In other words, when the semiconductor layer 907 is formed by applying the semiconductor ink within the aperture 905B and drying the ink, the drying of the semiconductor ink progresses in an irregular manner, and consequently the semiconductor layer would be uneven near the inner edges of the aperture 905B. Such unevenness of the semiconductor layer 907 causes variations in the properties of the semiconductor.

Such variations in the properties of a semiconductor caused by unevenness of the thickness of a semiconductor layer are problematic not only in a transistor, but also in other electronic devices having a semiconductor layer formed by a coating method, such as a photo sensor and a light-emitting element.

In the embodiments described below, the cause of the variations in the semiconductor properties and counter-measures for eliminating the cause are described in further details.

The following embodiments exemplify a TFT as an example of an electronic device pertaining to one aspect of the present invention. Note that each of the embodiments described below is a preferable example of the present invention. Any numeric values, shapes, materials, constituent elements, locations of the constituent elements, connection configurations, manufacturing steps and the orders of the steps referred to in the description of the embodiments are merely examples, and they are not intended to limit the present invention. Therefore, among the constituent elements of the embodiments, those not recited in the independent claims are explained as elements for embodying the present invention in a preferable form. Also note that the drawings are schematic and hence not necessarily faithful. The components shown in each drawing are not drawn to scale.

Embodiment 1

Figure 2:
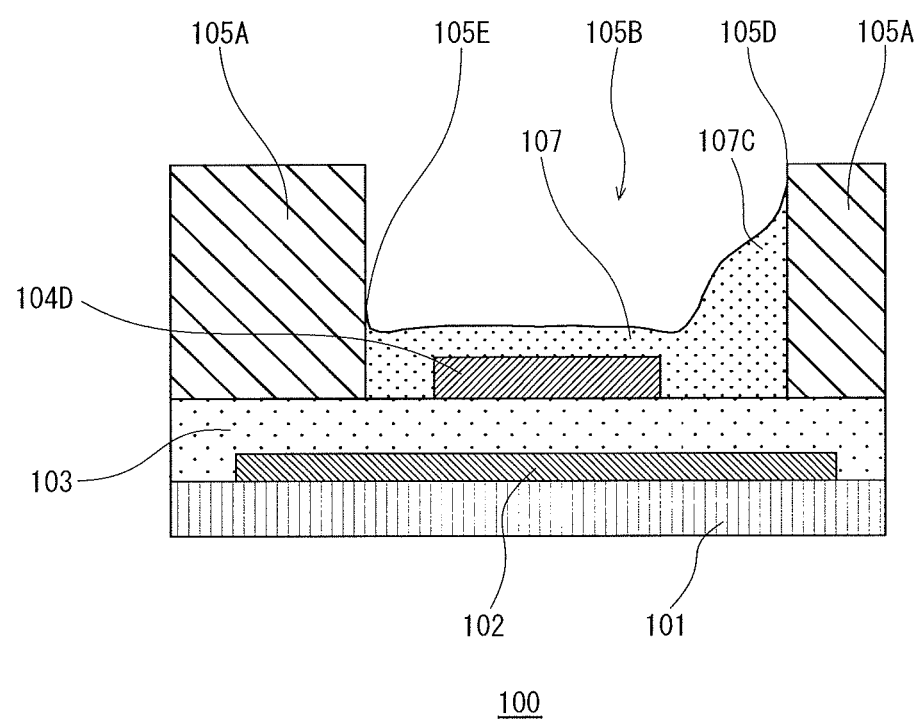
FIG. 2 is a schematic cross-sectional view illustrating the TFT pertaining to Embodiment 1.

Referring to FIG. 1 and FIG. 2, the following provides detailed description of components of a thin-film transistor (TFT) 100 pertaining to Embodiment 1 as an example of an electronic device pertaining to one aspect of the present invention. Note that FIG. 1 is a schematic top view of the TFT 100, and FIG. 2 is a schematic cross-sectional view of the TFT 100 along the dotted line A-A shown in FIG. 1.

1. Overall Configuration of TFT

As shown in FIG. 1 and FIG. 2, the TFT 100 includes a substrate 101, a gate electrode 102, a gate insulation layer 103, a pair of electrodes 104, a bank 105A, and a semiconductor layer 107. The pair of electrodes 104 is composed of a source electrode 104S and a drain electrode 104D.

Substrate

The substrate 101 is, for example, a glass substrate formed from a quarts glass or alkali-free glass, or a flexible substrate such as a plastic film. However, the material of the substrate 101 is not limited to them.

Gate Electrode

The gate electrode 102 is formed on the substrate 101 in a predetermined pattern. The gate electrode 102 has a single layer structure or a multilayer structure formed from an electrically-conductive material or an alloy thereof. For example, molybdenum (Mo), aluminum (Al), copper (Cu), tungsten (W), titanium (Ti), chromium (Cr) or MoW (molybdenum tungsten) may be used.

As shown in FIG. 1, the gate electrode 102 is, in top view, formed to cover the entire area of the aperture 105B of the bank 105A. However, such a configuration is not essential. The gate electrode 102 may be formed to cover a portion of the area within the aperture 105B. It suffices if the gate electrode 102 can efficiently apply voltage to the channel areas of the source electrode 104S and the drain electrode 104D.

Gate Insulation Layer

As shown in FIG. 2, the gate insulation layer 103 is formed on the gate electrode 102. In the present embodiment, the gate insulation layer 103 is formed across the entire surface of the substrate 101 so as to cover the gate electrode 102. The gate insulation layer 103 is formed from, for example, a single layer of a silicone oxide film or silicon nitride film, or an inorganic insulation film formed from a multilayer of these films. Alternatively, the gate insulation layer 103 may be formed from an organic insulating material such as polyimide, polyvinyl phenol, polypropylene, a styrene-containing material, or an acryl-containing material.

Source Electrode and Drain Electrode

As shown in FIG. 1 and FIG. 2, the source electrode 104S and the drain electrode 104D, which constitute the pair of electrodes 104, are located on the gate insulation layer 103 above the gate electrode 102, extending along the main surface of the substrate 101, with an interval therebetween. At least, the side of the source electrode 104S and the side of the drain electrode 104D which face each other (i.e. the side of the source electrode 104S and the side of the drain electrode 104D which are close to the central area of the aperture 105B) are located within the aperture 105B of the bank 105A.

The source electrode 104S and the drain electrode 104D are made, for example, of electrically-conductive material such as metal or an alloy, such as Mo, W, Cu, Al, Ni (nickel), Au (gold), Ag (silver), MoW, MoN (molybdenum nitride) or Pd (palladium). Alternatively, an electrically-conductive oxide such as ITO, IZO or ITZO may be selected. Each of the source electrode 104S and the drain electrode 104D may have a single layer structure or a multilayer structure including a plurality of layers.

In the present embodiment, the source electrode 104S and the drain electrode 104D are in contact with, and electrically connected to, the semiconductor layer 107 serving as a channel layer. Therefore, it is preferable that the work functions of the source electrode 104S and the drain electrode 104D are greater than the energy level represented by the HOMO level or the electron affinity of the semiconductor layer 107. Preferably, the source electrode 104S and the drain electrode 104D are formed from metal such as Au, Ni, Mo, MoW or MoN, or an alloy containing any of these metals, or a compound containing any of these metals.

In order to reduce the values of contact resistance with the semiconductor layer 107, the source electrode 104S and the drain electrode 104D may be formed as SAMs (self-assembled monolayers) for example, or be subject to washing by a UV (ultraviolet) ozone treatment for example. Besides, it is possible to determine the material considering both the HOMO level of the semiconductor layer 107 and the work functions of the pair of electrodes (i.e. the source electrode 104S and the drain electrode 104D).

For example, it is possible to realize a preferable ohmic contact with the semiconductor layer 107 (Generally, a p-type semiconductor has a work function of approximately 5.0 eV) by forming the source electrode 104S and the drain electrode 104D from Au (having a work function of 5.1 eV), MoWOx (having a work function of 5.3 eV), or Ni (having a work function of 5.2 eV) for example, and consequently it is possible to manufacture a TFT having a low ON resistance and exhibiting excellent ON-state properties.

Note that the semiconductor layer 107 may be of the N-type. The material of the electrodes is preferably selected according to the material of the semiconductor layer. In order to realize a uniform thickness, the film thickness of the semiconductor layer 107 is preferably twice the film thickness of the source electrode 104S and the drain electrode 104D and falls within the range of approximately 25 nm to approximately 100 nm, for example.

Bank

The bank 105A is formed on the gate insulation layer 103 so as to surround the respective end portions of the source electrode 104S and the drain electrode 104D which face each other in plan view. The aperture 105B of the bank 105A is formed on the gate insulation layer 103 above the gate electrode 102, in order to partition the semiconductor layer 107 for each pixel.

A portion of the source electrode 104S, a portion of the drain electrode 104D and a portion of the gate insulation layer 103 are located within the aperture 105B of the bank 105A. The bank 105A having the aperture 105B may be formed from a photo-sensitive material such as resist, or, alternatively, may be formed by exposing and developing a photo-sensitive material (bank material) with the use of a mask. Preferably, liquid-phobicity is provided to the surface of the bank 105A by, for example, selecting a fluorine-containing bank material or applying a surface treatment using fluorine, etc. to the bank 105A. Note that the term "liquid-phobicity" means a low affinity to the ink (i.e. a solution made by dissolving the semiconductor material in a solvent) used for forming the semiconductor layer 107. The same definition applies to the entire description of the present application.

Semiconductor Layer

The semiconductor layer 107 is formed within the aperture 105B of the bank 105A. The periphery of the semiconductor layer 107 is defined by the inner surface of the bank 105A surrounding the aperture 105B. Within the aperture 105B, the semiconductor layer 107 is formed over the respective end portions of the source electrode 104S and the drain electrode 104D facing each other, and over the upper surface of the gate insulation layer 103.

The semiconductor layer 107 is formed by applying ink within the aperture 105B of the bank 105A by a printing method such as an inkjet method, and drying the ink. The ink is formed by dissolving a material of the semiconductor layer 107, such as an organic material, an inorganic material or an oxide material, in a predetermined solvent.

The organic material of the semiconductor layer 107 is, for example, a soluble organic material containing pentacene, phthalocyanine or porphyrin. Examples of inorganic material is, for example, oxide semiconductor containing at least two of indium (In), gallium (Ga) and zinc (Zn).

Figure 14:
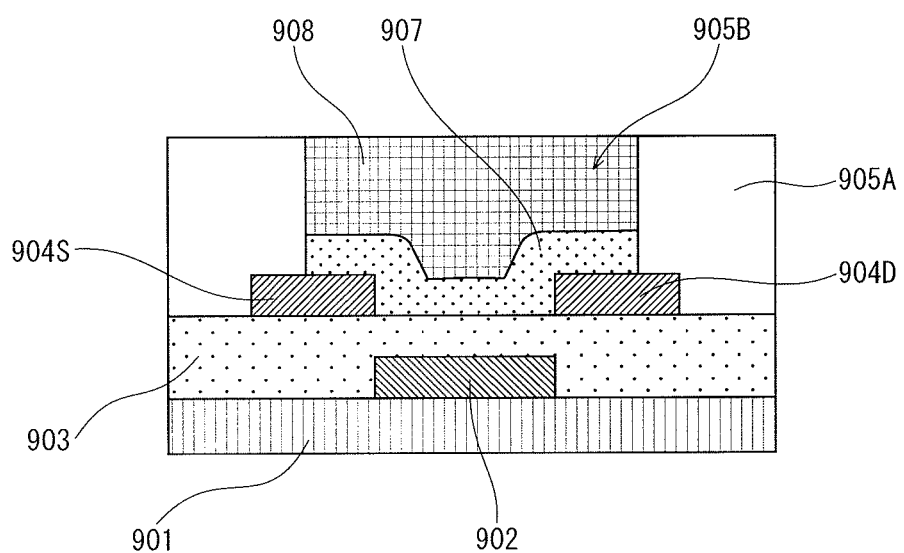
FIG. 14 is a schematic cross-sectional view illustrating a conventional TFT.

The protective film (not depicted in FIG. 1 or FIG. 2. See the protective film 908 shown in FIG. 14) is formed on the semiconductor layer 107 in order to protect the semiconductor layer 107. In the present embodiment, the protective film is formed within the aperture 105B of the bank 105A so as to cover the semiconductor layer 107.

Here, the protective film preferably contains a photo-crosslinked material. In photo-crosslinked material, molecular binding occurs when irradiated with light, and the resulting closely-packed molecular configuration strengthens the polymeric linkage. Such a protective film effectively prevents water, oxygen and impurities from entering the semiconductor layer 107. Examples of the photo-crosslinked material include an acrylic polymer, a high-polymer material such as styrene-containing material, and a low-molecular material such as acrylic monomer. Preferably, the protective film includes a thermal-crosslinked material in addition to a photo-crosslinked material. The material of the protective film is not limited to the organic material, and may be an organic material added with an inorganic material such as silicon. When an organic material added with an inorganic material such as silicon is used, the protective film can more effectively prevent water and oxygen from entering the semi-conductor layer 107 compared to an organic protective film made only of an organic material. In addition, the protective film may be colored so that the protective film has light-blocking effect.

2. Shape of Apertures and Film Thickness of Semiconductor Layer

Regarding the aperture 105B shown in FIG. 1, when attention is paid to a first edge 105C1 which is a straight line segment included in an outline 105C of the aperture 105B in top view, a first connector 105D and a second connector 105E continuous with the ends of the first edge 105C1 have different shapes. The following provides more specific explanation. The outline of the 105C of the aperture 105B in plan view includes the first edge 105C1, a second edge 105C2 and a third edge 105C3, which are straight line segments. The first edge 105C1 and the second edge 105C2 are connected via the first connector 105D, and the first edge 105C1 and the third edge 105C3 are connected via the second connector 105E. Compared to the first connector 105D, the second connector 105E is shifted toward the center of the aperture 105B.

Here, the degree of shifting of the first connector 105D can be expressed by the area of a first connector region 105D1 surrounded by a first imaginary straight line 105C1a, which extends along the first edge 105C1, a second imaginary straight line 105C2a, which extends along the second edge 10502, and the first connector 105D. Similarly, the degree of shifting of the second connector 105E can be expressed by the area of a second connector region 105E1 surrounded by the first imaginary straight line 105C1a, a third imaginary straight line 105C3a, which extends along the third edge 105C3, and the second connector 105E. Thus the second connector region 105E1 has a larger area than the first connector region 105D1. In the TFT 100 pertaining to the present embodiment, the first connector 105D is not shifted toward the center of aperture 105B. Accordingly, the first connector 105D is located in the first imaginary straight line 105C1a and the second imaginary straight line 105C2a. Therefore, the area of the first connector region 105D1 is zero.

When the point of intersection of the first imaginary straight line 105C1a and the second imaginary straight line 105C2a is defined as a first intersection point P1 and the point of intersection of the first imaginary straight line 105C1a and the third imaginary straight line 105C3a is defined as a second intersection point P2, the outline 105C of the aperture 105B in plan view can be expressed in the following manner. The first intersection point P1 is located in the first connector 105D, and the second intersection point P2 is located outside the outline 105C (i.e. outside the second connector 105E). This means that the first connector 105D and the second connector 105E are not located outside the first, second, and third edges, or the first, second and third imaginary straight lines.

Since some of the plurality of connectors of the aperture 105B (the second connector 105E in this example) is shifted toward the center of the aperture 105B compared to the other connectors (the first connector 105D in this example), the semiconductor ink applied within the aperture 105B is likely to flow from the second connector 105E to the first connector 105D while drying. In other words, the semiconductor ink during the drying, which conventionally flows in random directions, is controlled to flow toward the first connector 105D, so that the ink dries orderly. As a result, the stated configuration reduces the variations of the thickness of the semiconductor layer 107. In particular, the stated configuration reduces the variations of the film thickness near the inner edges of the aperture 105B where the semiconductor ink is likely to climb the lateral surface of the bank 105A surrounding the aperture 105B. Consequently, the stated configuration reduces variations in the properties of the TFT.

Here, the following can be a reason why the semiconductor ink is likely to flow from the connector shifted by a large amount toward the center of the aperture 105B (the second connector 105E in this example) toward the connector shifted by a small amount (the first connector 105D in this example). At a connector shifted by a small amount toward the center of the aperture, the distance between the two edges of the aperture, which are continuous with the connector, is small. Accordingly, the semiconductor ink has a higher surface tension near the connector, and swells out more. Due to the swelling, the surface area of the semiconductor ink increases, and the solvent becomes more likely to evaporate. As a result, due to the coffee ring effect, the semiconductor ink becomes likely to flow toward the connector shifted by a small amount (the first connector 105D in this example) from other areas.

Another possible reason is as follows. The vapor concentration of the solvent is high above the area where the semiconductor ink exists (within the aperture 105B), but is low above the area where the semiconductor ink does not exist (the bank 105A). The solvent evaporates more easily in an area with a low vapor concentration than in an area with a high vapor concentration. Since the vapor concentration is relatively lower near the bank 105A than at the center of the aperture 105A, the semiconductor ink is more easily evaporate near the bank 105A than at the center of the aperture 105A. At the connector shifted by a small amount toward the center of the aperture, the length of the boundary of the semiconductor ink facing the bank 105A is longer than at the connector shifted by a large amount toward the center of the aperture. Therefore, the vapor concentration is lower near the connector shifted by a small amount toward the center of the aperture, and the solvent is more easily evaporate. As a result, due to the coffee ring effect, the semiconductor ink becomes likely to flow toward the connector shifted by a small amount (the first connector 105D in this example) from other areas.

In the cross-sectional view of the TFT 100 shown in FIG. 2, the semiconductor layer 107 has a large film thickness near the first connector 105D due to the semiconductor ink flowing toward the first connector 105D, and a slope 107C is formed along the inner wall of the bank 105A.

When providing a plurality of connectors of the same type (the second connector 105E for example), it is preferable that, as shown in FIG. 1, connectors of different types (the first connector 105D and the second connector 105E for example) are connected with the ends of a single edge. If the second connector 105E is connected to each end of a single edge, the flow of ink is not likely to occur, because the ink in the area between the two second connectors 105E (i.e. the area near the single edge) is equally flowable towards the both ends. As a result, there are possibilities that the drying of the ink would progress in random directions, and considerable variations would occur in the film thickness of the semiconductor layer 107. The configuration in which connectors of different types are connected with the ends of a single edge can reduce such variations in the film thickness of the semiconductor layer 107.

3. Shape of Aperture and Arrangement of Electrodes

The following describes the shape of the aperture and the arrangement of the source electrode and the drain electrode.

Figure 17:
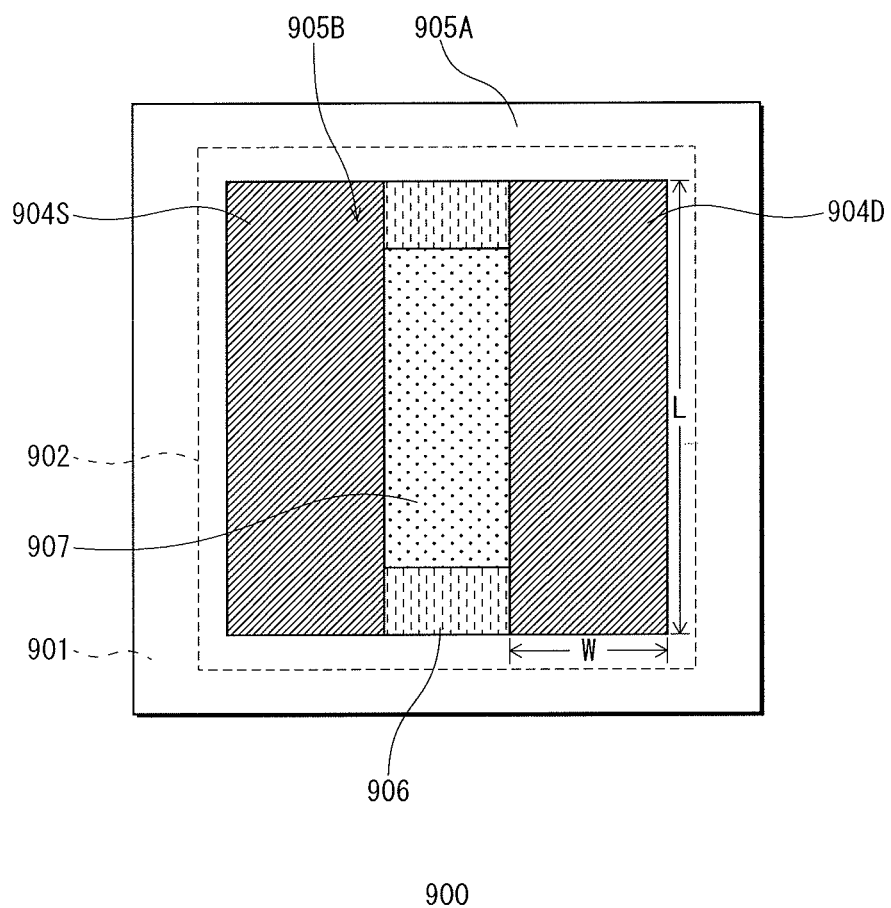
FIG. 17 is a schematic top view illustrating a conventional TFT.

As in the conventional TFT 900 shown in FIG. 17, when the source electrode 904S and the drain electrode 904D are parallel electrodes disposed along two parallel edges of the aperture 905 and have a rectangular shape in plan view, the semiconductor ink applied is likely to be retained near the side wall of the bank 905A surrounding the aperture 905B. In particular, since the area between the source electrode 904S and the drain electrode 904D is located at a lower level than the rest, the semiconductor ink is likely to be retained and form a slope 906 in this area. In this case, the quality of the crystals in the semiconductor layer 907 is degraded (i.e. the diameter of the crystal particles becomes smaller), which can be a cause of the hump phenomenon.

In the TFT 100 pertaining to the present embodiment, as shown in FIG. 1, the longitudinal ends of each of the source electrode 104S and the drain electrode 104D are set back in the direction from the edge of the aperture 105B toward the inside of the aperture 105B unlike the electrodes of the conventional TFT shown in FIG. 17. In other words, the longitudinal ends of each of the source electrode 104S and the drain electrode 104D are, in plan view, separated from the lateral surface of the bank 105A surrounding the aperture 105B.

Note that the longitudinal direction of each electrode is the direction along the length L of the electrode as shown in FIG. 17. The width of each electrode is denoted as W. Here, the longitudinal direction of the electrodes coincides with the longitudinal direction of the channel area.

Thus the above-described configuration prevents the semiconductor ink from being retained within the channel area 107D between the source electrode 104S and the drain electrode 104D, and accordingly reduces the variations of the film thickness of the semiconductor layer 107 within the channel area 107D and variations in the properties of the transistor.

The semiconductor ink is likely to flow toward the first connector 105D and is likely to be retained near the first connector 105D. As a result, the semiconductor ink is more likely to climb the inner surface of the bank near the first connector 105D than near the second connector 105E. Therefore, it is preferable that the source electrode 104S and the drain electrode 104D are separated from at least the first connector 105D in order to prevent the channel area from being formed near the first connector 105D. In the TFT 100 pertaining to the present embodiment, the source electrode 104S and the drain electrode 104D are, as described above, located such that the longitudinal ends of each of the source electrode 104S and the drain electrode 104D are separated from the inner surface of the bank 105A surrounding the aperture 105B in plan view. Therefore, the source electrode 104S and the drain electrode 104D are separated from the first connector 105D, and the channel area 107D is formed in an area that is not close to the first connector 105D.

Note that the channel area 107D may be close to the second connector 105E, because variations of the film thickness of the semiconductor layer 107 are more unlikely to occur near the second connector 105E than near the first connector 105D.

4. Method of Manufacturing TFT

The following described a method of manufacturing the TFT 100 with reference to FIGS. 3 through 6, taking as an example a method of manufacturing a thin-film transistor substrate (TFT substrate) 1010 having the TFT 100.

Figure 3:
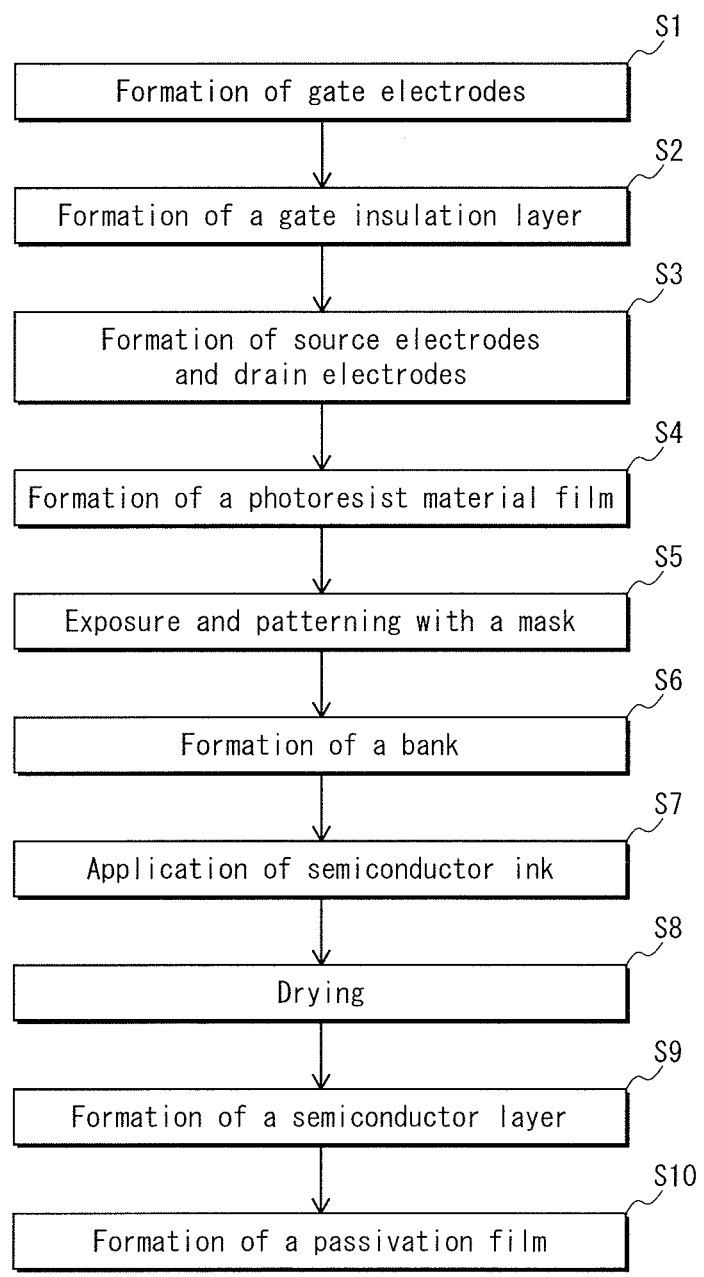
FIG. 3 is a flowchart illustrating a process of manufacturing the TFT pertaining to Embodiment 1.

FIG. 3 is a flowchart illustrating a method of manufacturing the TFT 100. FIGS. 4A, 4B and 4C, FIGS. 5A, 5B and 5C, and FIGS. 6A and 6B are schematic cross-sectional views illustrating a part of the process of manufacturing the TFT substrate 1010 having the TFT 100.

Figure 4A:
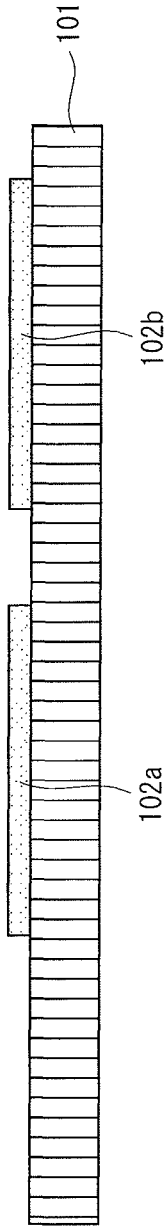
FIGS. 4A through 4C are schematic cross-sectional views illustrating part of the process of manufacturing the TFT pertaining to Embodiment 1, where

As shown in FIG. 4A, gate electrodes 102 (102a, 102b) are formed on a main surface of the substrate 101 (Step S1 in FIG. 3). The gate electrodes 102a and 102b are formed in the following manner. First, metal material for forming the gate electrodes 102 is deposited on the substrate 101 formed from glass or plastic for example, thereby forming a first metal film (a gate metal film). The first metal film is formed from Mo, Al, Cu, W, Ti, Cr, Mo, MoW, or ITO for example, by a sputtering method, a vapor deposition method, or a printing method for example. Subsequently, the gate electrodes 102 having a predetermined shape are formed on the substrate 101 by patterning the first metal film by photolithography and etching. Note that the etching applied to the first metal film may be wet etching or dry etching.

Figure 4B:
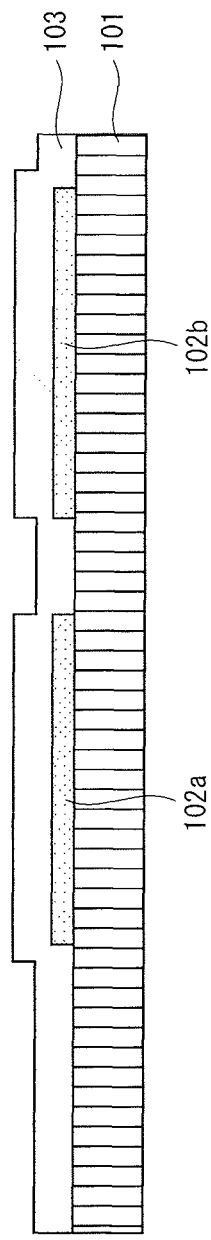

Subsequently, as shown in FIG. 4B, a gate insulation layer 103 is layered so as to cover the gate electrodes 102a and 102b and the substrate 101 (Step S2 in FIG. 3).

The gate insulation layer 103 may be formed by plasma CVD or a coating method, depending on the material. For example, when the gate insulation layer 103 is an inorganic insulation film such as a silicone oxide film or a silicon nitride film, the gate insulation layer 103 may be formed by plasma CVD. When the gate insulation layer 103 is an organic insulation film such as a styrene-containing film, an imide-containing film, a polyvinyl phenol film or a polypropylene film, the gate insulation layer 103 may be formed by a coating method.

Note that contact holes may be thereafter provided in the gate insulation layer 103 on the gate electrode 102 as necessary. The contact holes are formed in order to electrically connect the gate electrodes 102 of the TFT 100 with the source electrodes 104S and the drain electrodes 104D of another TFT that is adjacent to the TFT 100. When the gate insulation layer 103 is photosensitive and formed by a coating method, the contact holes may be formed by patterning via a photolithography method. When the gate insulation layer 103 is not photosensitive and formed by plasma CVD, the contact holes may be formed by dry etching or wet etching after patterning a resist.

Figure 4C:
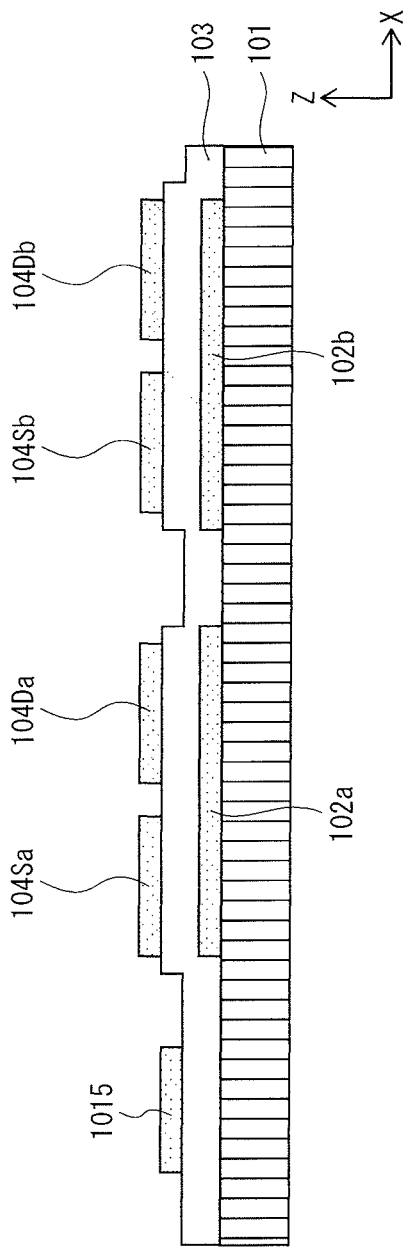

Subsequently, as shown in FIG. 4C, the source electrodes 104S (104Sa, 104Sb) and the drain electrodes 104D (104Da, 104Db) and connection wiring 1015 are formed on the gate insulation layer 103 (Step S3 in FIG. 3). The source electrodes 104S, the drain electrodes 104D, and the connection wiring 1015 are formed in the following manner. First, metal material for forming the source electrodes 104S and the drain electrodes 104D is deposited on the gate insulation layer 103, thereby forming a second metal film. When contact holes are provided above the gate electrode 102, the metal material deposits within each contact hole, thereby forming a metal thin film which serves as a contact portion. The second metal film is formed from metal material such as Mo, W, Cu, Al, Ni, Au, Ag, MoW or MoN, or a metal oxide such as ITO, by a sputtering method or a vapor deposition method. In the present embodiment, the second metal film is a single layer of MoW for example. The source electrodes 104S, the drain electrodes 104D, and the connection wire 1015 are formed by patterning the second metal film.

Subsequently, as shown in FIG. 5A, a photoresist material film 105 for forming the bank 105A is formed so as to cover the source electrodes 104Sa and 104Sb, the drain electrodes 104Da and 104Db and the connection wiring 1015 (Step S4 in FIG. 3). Then, as shown in FIG. 5B, a mask 501 is placed above the photoresist material film 105, and mask exposure and patterning is performed (Step S5 in FIG. 3). Here, the mask 501 has windows 501a, 501b, 501c and 501d which correspond in position to the areas where the banks 105A are to be formed. Although not illustrated in FIG. 5B, the mask 501 also has windows corresponding in position to the peripheral area of the display, where the banks 105A is to be formed as well, in addition to the windows 501a, 501b, 501c and 501d for forming the banks 105A used in the TFT 100.

Note that a surface treatment using fluorine for example may be applied to the surfaces of the banks 105A after forming the apertures 105B in order to provide liquid-phobicity to the surfaces of the banks 105A (particularly to the lateral surface surrounding the aperture 105B).

The banks 105A shown in FIG. 5C are formed in the above-described manner (Step S6 in FIG. 3). The banks 105A define a plurality of apertures 105B including apertures 105Ba, 105Bb and 105Bc. A source electrode 104Sa and a drain electrode 104Da are located within the aperture 105Ba, a source electrode 104Sb and a drain electrode 104Db are located within the aperture 105Bb, and the connection wiring 1015 is located within the aperture 105Bc. The source electrode 104Sa and the drain electrode 104Da are in parallel with each other within the aperture 105Ba, and the source electrode 104Sb and the drain electrode 104Db are in parallel with each other within the aperture 105Bb. Note that the apertures 105Ba, 105Bb and 105Bc may be collectively referred to as simply "the aperture 105B" when it is unnecessary to distinguish them from each other.

Figure 6A:
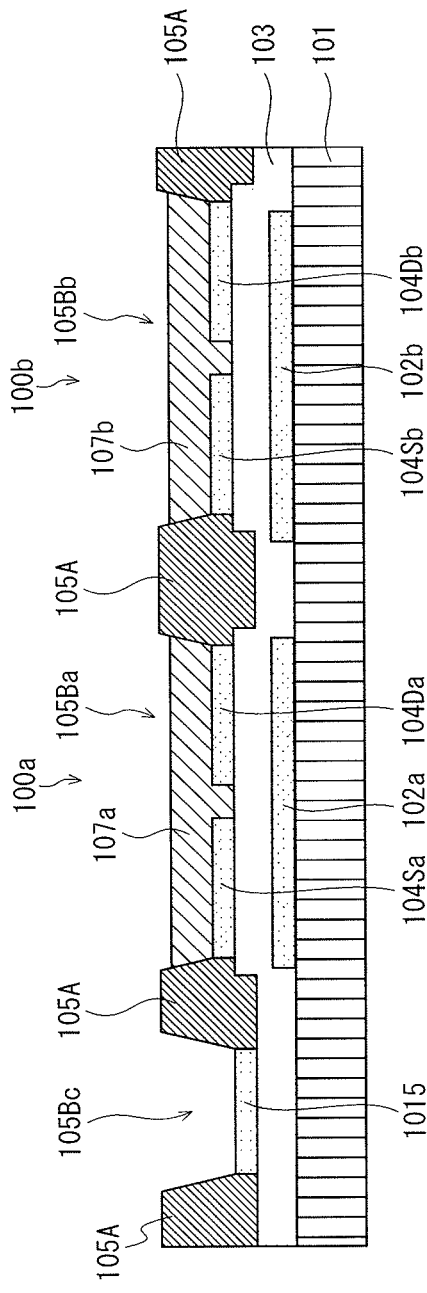
FIGS. 6A and 6B are schematic cross-sectional views illustrating part of the process of manufacturing the TFT continued from FIG. 5C, where

As shown in FIG. 6A, after forming the banks 105A, semiconductor ink for forming semiconductor layers 107a and 107b is applied within the apertures 105Ba and 105Bb defined by the banks 105A (Step S7 in FIG. 3). The solution containing the semiconductor material spreads over the upper surface of the gate insulation layer 103 exposed from the apertures 105B while spreading over the upper surfaces of the end portions of the source electrode 104S and the drain electrode 104D exposed from the apertures 105B.

The semiconductor material is, for example, a soluble organic material containing pentacene, phthalocyanine or porphyrin. Alternatively, oxide semiconductor ink containing indium (In), gallium (Ga) or zinc (Zn) such as InGaZnO, or a precursor ink may be used, for example. The semiconductor layers 107a and 107b may also be collectively referred to as simply "the semiconductor layer 107" when it is unnecessary to distinguish them from each other.

Subsequently, by drying the semiconductor ink (Step S8 in FIG. 3), the semiconductor layers 107a and 107b are formed within the apertures 105Ba and 105Bb respectively as shown in FIG. 6A (Step S9 in FIG. 3). In the present embodiment, the semiconductor ink is dried by a heat treatment at approximately 200° C. Note that the semiconductor ink is dried by applying a given heat treatment to the semiconductor ink. Preferably, the heating temperature and the heating time of the heat treatment are determined according to the semiconductor material to be used.

Figure 6B:
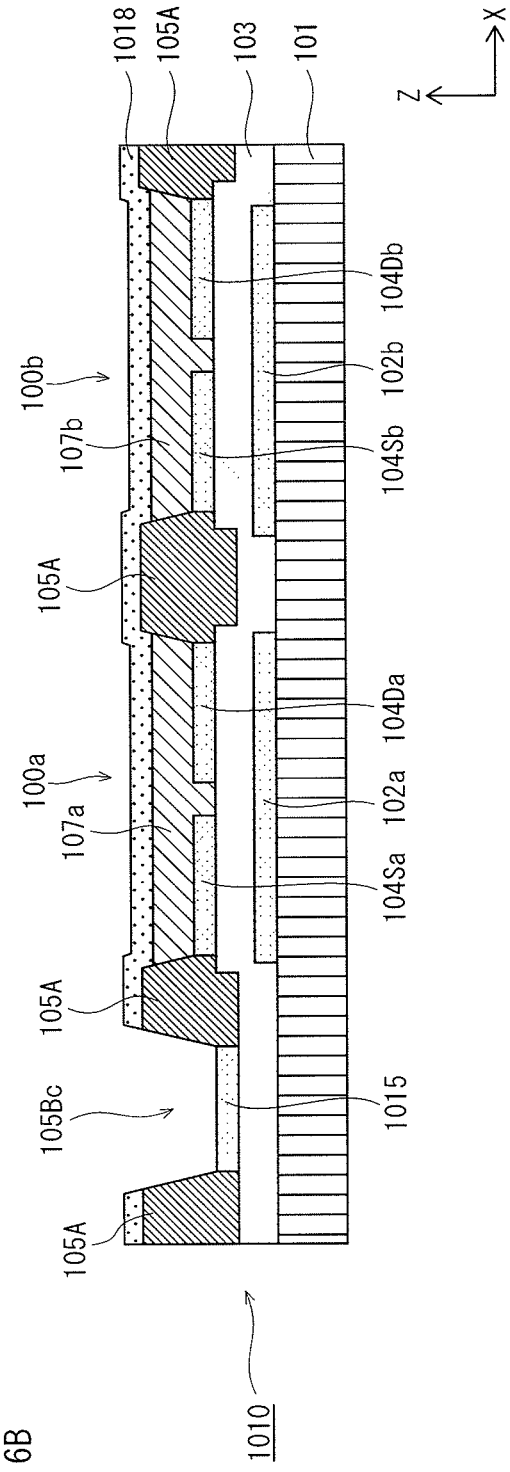

Finally, as shown in FIG. 6B, a passivation film (an overcoat layer) 1018 serving as a protective film is formed to cover the entire surface except, for example, the apertures 105Bc enclosing the connection wire 1015 (Step S10 in FIG. 3). This completes the TFT substrate 1010 having the TFT 100.

When the overcoat material (the material of the passivation film 1018) contained in the solution used for forming the passivation film 1018 contains a thermal-crosslinked substance, it is possible to improve the protection effect of the passivation film 1018 by applying a heat treatment. When the overcoat material contains a photo-crosslinked substance, it is possible to cause molecular binding in the overcoat material by irradiation of UV light for example, and the resulting closely-packed molecular configuration strengthens the polymeric linkage. Thus it is possible to improve the blocking effect of the passivation film 1018 against oxygen, water and impurities.

Note that the passivation film 1018 is not illustrated in FIG. 1 or FIG. 2. Similarly, the passivation film of Embodiment 2 to Embodiment 6 is not illustrated in the drawings.

When using an inkjet method, it is preferable that the solution containing the overcoat material is dripped to an area near the center of the aperture 105B of each bank 105A. If this is the case, the solution containing the overcoat material spreads more uniformly than when the solution is dripped to an area near the inner edge of the aperture 105B, which leads to formation of a more uniform protective film. Also, although the overcoat material of the present embodiment is formed by an inkjet method, it may be formed by a spin coat method to cover the entire surface. Even if this is the case, the passivation film serving as a protective film has the same effect if only it has a sufficient film thickness for covering the semiconductor layer 107.

This completes a transistor substrate having TFT elements.

Embodiment 2

Figure 7:
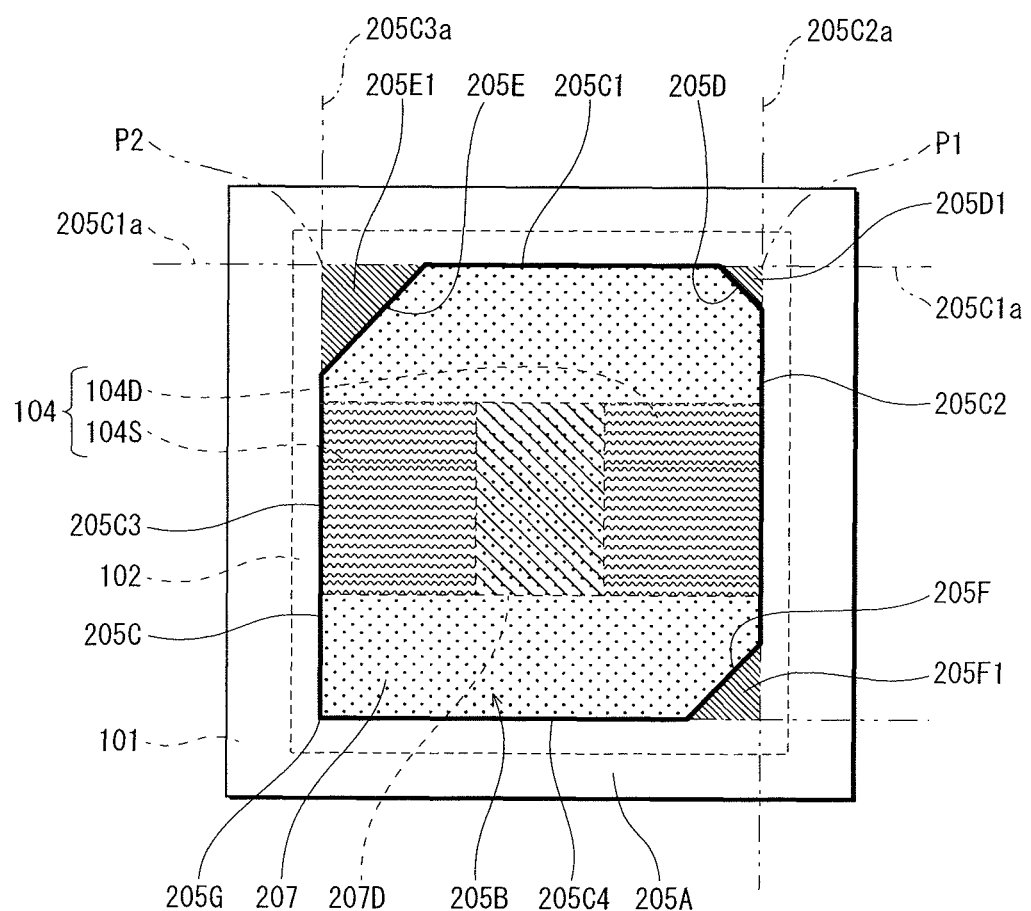
FIG. 7 is a schematic top view illustrating a TFT pertaining to Embodiment 2.

FIG. 7 is a schematic top view illustrating a TFT 200 pertaining to Embodiment 2. In FIG. 7, configuration elements which are the same as in the TFT 100 pertaining to Embodiment 1 are labeled using the same reference signs and explanation thereof is omitted. Similarly, in each of the embodiments shown below, configuration elements which are the same as in any of the embodiments already described are labeled using the same reference signs and explanation thereof is omitted.

The TFT 200 pertaining to Embodiment 2 is different from TFT 100 pertaining to Embodiment 1 in the shape of the apertures in plan view. The following provides specific explanation. In the TFT 200, an outline 205C of an aperture 205B of a bank 205A in plan view includes a first connector 205D and a second connector 205E. Both the first connector 205D and the second connector 205E are shifted toward the center of the aperture 205B, and the second connector 205E is shifted further toward the center of the aperture 205B than the first connector 205D. In other words, the second connector region 205E1 has a larger area than the first connector region 205D1.

Note that the bank 205A is the same as the bank 105A pertaining to Embodiment 1 in terms of the material and the method of forming, expect for the shape of the aperture 205B. Also, the semiconductor layer 207 is the same as the semiconductor layer 107 pertaining to Embodiment 1 in terms of the material and the method of forming, except for the shape which is different according to the change in the shape of the aperture 205B.

In the TFT 200 pertaining to the present embodiment, as in the TFT 100, the first connector 205D and the second connector 205E continuous with the first edge 205C1 have different shapes in plan view of the aperture 205B of the bank 205A, i.e., the second connector 205E is shifted further toward the center of the aperture 205B than the first connector 205D.

Therefore, the semiconductor ink is likely to flow from the second connector 205E to the first connector 205D while drying. Thus, the stated configuration reduces the variations of the film thickness of the semiconductor layer 207.

In the TFT 200 pertaining to the present embodiment, as in the TFT 100, the longitudinal ends of each of the source electrode 104S and the drain electrode 104D are separated from the inner edge of the aperture 205B, and the channel area 207D is separated from the first connector 205D. Since the channel area is not formed in the area where the semiconductor layer 207 is likely to have a slope, the stated configuration reduces the variations in the properties of the transistor.

The first intersection point P1 is located outside the outline 205C (i.e. outside the first connector 205D), and the second intersection point P2 is located outside the outline 205C (i.e. outside the second connector 205E). This means that the first connector 205D and the second connector 205E are not located outside the first, second, and third edges, or the first, second and third imaginary straight lines.

Note that, as shown in FIG. 7, the third connector 205F, which is continuous with the second edge 205C2 and is located opposite the first connector 205D, may be shifted toward the center of the aperture 205B. If this is the case, the degree of shifting of the third connector 205F may be different from the degree of shifting of the first connector 205D and the second connector 205E, as shown in FIG. 7. In other words, the area of the third connector region 205F1 may be different from the area of the first connector region 205D1 and the area of the second connector region 205E1. Alternatively, the degree of shifting of the third connector 205F may be approximately the same as the degree of shifting of the second connector 205E. The second connector 205E is located at the opposite corner as the third connector 205F. This configuration substantially equalizes the height of the slope of the semiconductor layer 207 near the second connector 205E and the height of the slope of the semiconductor layer 207 near the third connector 205F at the opposite corner as the second connector 205E.

Furthermore, regarding the first connector 205D and the third connector 205F, which are continuous with the second edge 205C2, the third connector 205F is shifted further toward the center of the aperture 205B than the first connector 205D. This means that the positional relationship between the first connector 205D and the third connector 205F with respect to the second edge 205C2 is the same as the positional relationship between the first connector 205D and the second connector 205E with respect to the first edge 205C1. Similarly, regarding the fourth connector 205G and the second connector 205E which are continuous with the third edge 205C3, the second connector 205E is shifted further toward the center of the aperture 205B than the fourth connector 205G. This relationship is the same as the relationship between the first connector 205D and the second connector 205E which are continuous with the first edge 205C1. Similarly, regarding the fourth connector 205G and the third connector 205F which are continuous with the fourth edge 205C4, the third connector 205F is shifted further toward the center of the aperture 205B than the fourth connector 205G. This relationship is the same as the relationship between the first connector 205D and the second connector 205E which are continuous with the first edge 205C1.

The most effective configuration is the configuration in which every edge in the outline 205C has a connector that is shifted further toward the center of the aperture 205B than the other connector, as described above. If this is the case, the semiconductor ink is likely to flow from a connector shifted by a large amount to a connector that is shifted by a small amount. Consequently, the variations of the film thickness of the semiconductor layer are reduced near every edge. However, such a configuration is not essential. Presumably, it is possible to reduce the variations of the film thickness of the semiconductor layer to some extent by configuring at least one of a plurality of connectors included in the outline to be sifted by a different amount compared to the other connectors. For example, when only one of the plurality of connectors included in the outline 205C is configured as the second connector 205E and all the other connectors are configured as the first connector 205D, the ink is likely to flow from the second connector 205E to the other connectors, and consequently the variations of the film thickness of the semiconductor layer are reduced to some extent.

Embodiment 3

In the TFT 100 pertaining to Embodiment 1 and the TFT 200 pertaining to Embodiment 2, the first connector and the second connector are straight line segments. However, the connectors are not necessarily straight line segments.

Figure 8:
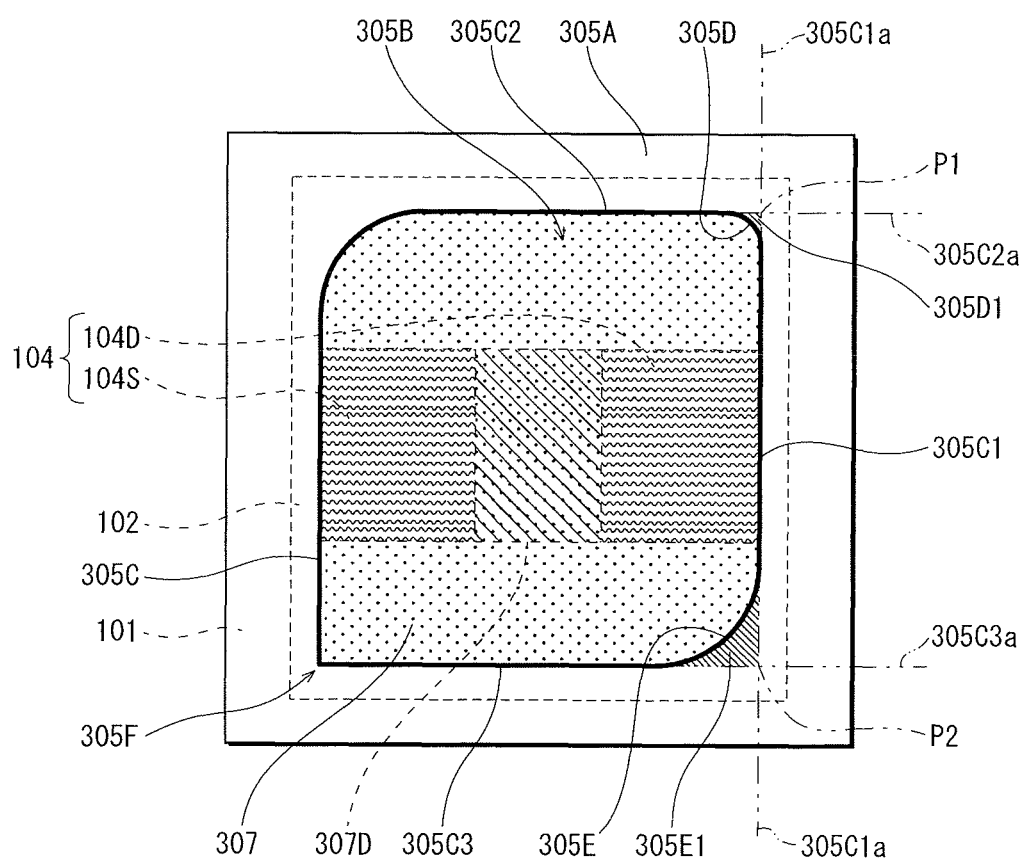
FIG. 8 is a schematic top view illustrating a TFT pertaining to Embodiment 3.

FIG. 8 is a schematic top view illustrating a TFT 300 pertaining to Embodiment 3. As shown in FIG. 8, both the first connector 305D and the second connector 305E of the TFT 300 have a round (arc-like) shape. Compared to the first connector 305D, the second connector 305E is shifted further toward the center of the aperture 305B. In other words, the second connector 305E has a greater radius of curvature than the first connector 305D. In other words, compared to the area of the first connector region 305D1, which is a region surrounded by the first imaginary straight line 305C1a extending along the first edge 305C1, the second imaginary straight line 305C2a extending along the second edge 305C2, and the first connector 305D, the area of the second connector region 305E1, which is a region surrounded by the first imaginary straight line 305C1a, the third imaginary straight line 305C3a extending along the third edge 305C3, and the second connector 305E, is greater.

The first intersection point P1 is located outside the outline 305C (i.e. outside the first connector 305D), and the second intersection point P2 is located outside the outline 305C (i.e. outside the second connector 305E). This means that the first connector 305D and the second connector 305E are not located outside the first, second, and third edges, or the first, second and third imaginary straight lines.

In the TFT 300 pertaining to the present embodiment having such a configuration, as in the TFTs 100 and 200, the semiconductor ink is likely to flow from the second connector 305E to the first connector 305D while drying. Thus, the stated configuration reduces the variations of the film thickness of the semiconductor layer 307.

In the TFT 300 pertaining to the present embodiment, as in the TFTs 100 and 200, the longitudinal ends of each of the source electrode 104S and the drain electrode 104D are separated from the inner edge of the aperture 305B, and the channel area 307D is separated from the first connector 305D. Since the channel area is not formed in the area where the semiconductor layer 307 is likely to have a slope, the stated configuration reduces the variations in the properties of the transistor.

Note that the bank 305A is the same as the bank 105A pertaining to Embodiment 1 in terms of the material and the method of forming, expect for the shape of the aperture 305B. Also, the semiconductor layer 307 is the same as the semiconductor layer 107 pertaining to Embodiment 1 in terms of the material and the method of forming, except for the shape which is different according to the change in the shape of the aperture 305B.

In the TFT 300, both the first connector 305D and the second connector 305E have a round shape and are shifted toward the center of the aperture 305B. However, such a configuration is not essential. For example, it is possible that one of the first connector and the second connector is not shifted toward the center of the aperture 305B, like the third connector 305F shown in FIG. 8.

Even when the TFT has a connector having a round shape as in the TFT 300 pertaining to the present embodiment, it is preferable that the connectors continuous with each edge included in the outline 305C are shifted toward the center of the aperture 305B by different amounts.

Furthermore, the outline 305C may include both a connector having a round shape and a connector having a straight shape. For example, it is possible that a connector continuous with one end of one edge has a straight shape and a connector continuous with the other end of the edge has a round shape.

Embodiment 4

In the TFTs pertaining to Embodiments 1 through 3, each of the source electrode and the drain electrode has a rectangular shape in plan view. However, such a configuration is not essential.

Figure 9:
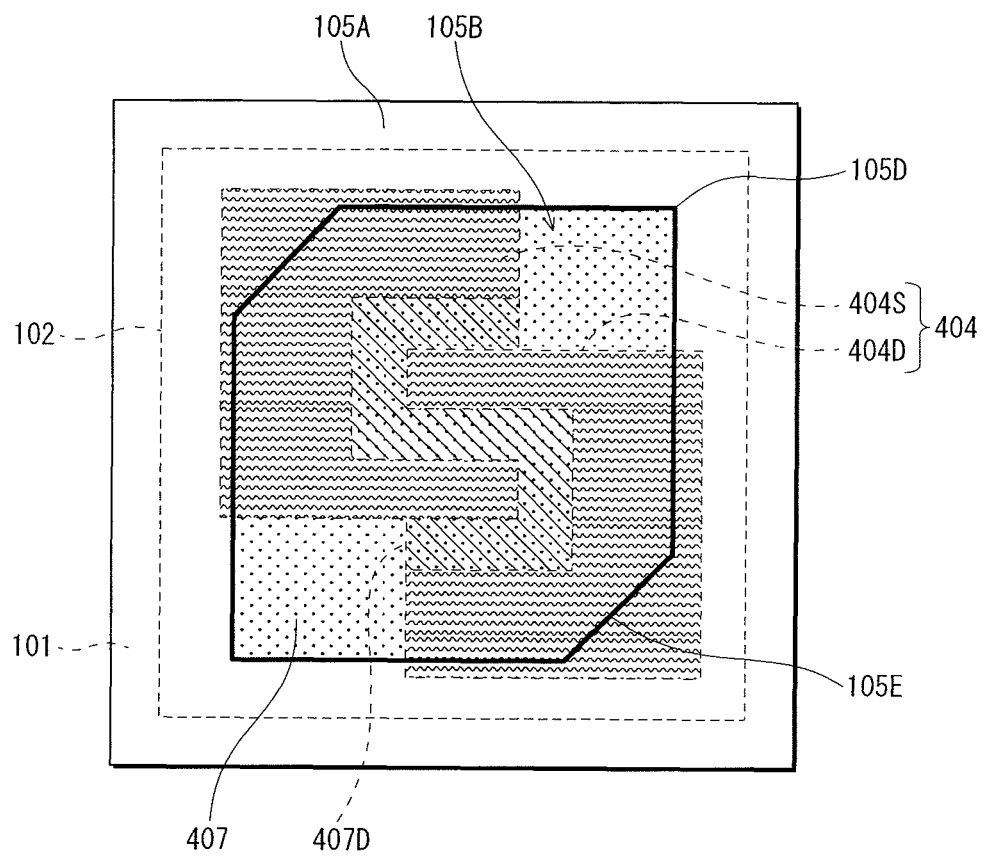
FIG. 9 is a schematic top view illustrating a TFT pertaining to Embodiment 4.

FIG. 9 is a schematic top view illustrating a TFT 400 pertaining to Embodiment 4. The pair of electrodes 404 of the TFT 400, namely the source electrode 404S and the drain electrode 404D, are formed in a comb-like pattern in plan view. Within the aperture 105B of the bank 105A, the source electrode 404S and the drain electrode 404D are located so as not to overlap the area near the first connector 105D. This is for the same reasons as explained as to Embodiment 1. As shown in FIG. 9, in the TFT 400 pertaining to the present embodiment, the source electrode 404S and the drain electrode 404D, which are formed in a comb-like pattern, are separated from the area near the first connector 105D. Accordingly, the first connector 105D is located so as not to overlap the area between the source electrode 404S and the drain electrode 404D, i.e. so as not to overlap the channel area 407D.

Since the first connector 105D where a slope of the semiconductor ink is likely to occur is not included in the channel area 407D, the stated configuration reduces variations of the properties of the semiconductor layer 407.

Furthermore, the second connectors 105E are formed so as to overlap the source electrode 404S and the drain electrode 404D in plan view. Compared to the gate insulation layer 103, the source electrode 404S and the drain electrode 404D have a higher degree of wettability to the semiconductor ink for forming the semiconductor layer 107, and accordingly the source electrode 404S and the drain electrode 404D are likely to attract the ink material of the semiconductor layer 107. Therefore, in the area near the edges of the aperture 105B, a slope of the ink is more likely to be high in the area overlapping the source electrode 404S and the area overlapping the drain electrode 404D. Since the second connector 105E is formed in the area overlapping the source electrode 404S and the area overlapping the drain electrode 404D, the portion of the semiconductor ink on the source electrode 404S and the portion of the semiconductor ink on the drain electrode 404D are likely to flow toward the area near the first connector 105D. As a result, the stated configuration reduces the amount of the portion of the semiconductor ink on the source electrode 404S and the amount of the portion of the semiconductor ink on the drain electrode 404D, thereby preventing occurrence of a slope of the ink material.

Note that the source electrode 404S and the drain electrode 404D are basically the same as the source electrode 104S and the drain electrode 104D pertaining to Embodiment 1 in terms of the material and the method of forming, expect for the shape and the locations thereof. Also, the semiconductor layer 407 is the same as the semiconductor layer 107 pertaining to Embodiment 1 in terms of the material and the method of forming, except for the shape of the channel area 407D which is different according to the change in the shape of the source electrode 404S and the drain electrode 404D.

Embodiment 5

In the TFT 400 pertaining to Embodiment 4, the second connectors 105E are located to overlap the source electrode 404S and the drain electrode 404D in plan view. However, such a configuration is not essential.

Figure 10:
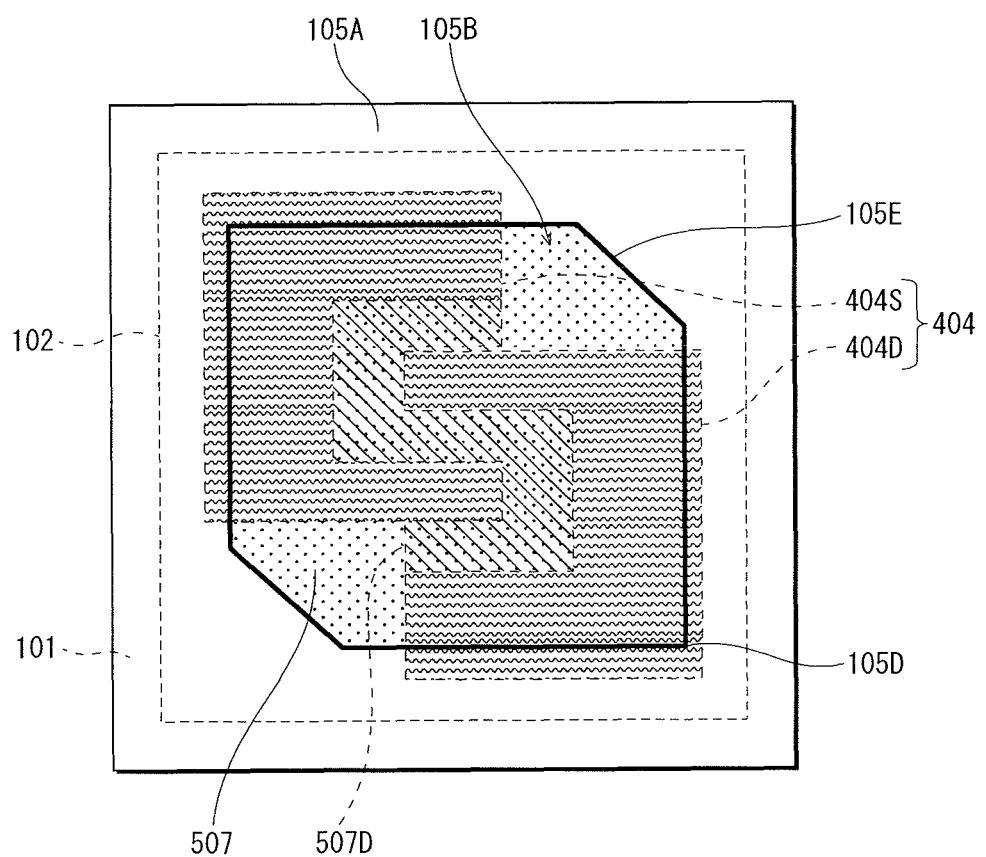
FIG. 10 is a schematic top view illustrating a TFT pertaining to Embodiment 5.

As in the TFT 500 pertaining to Embodiment 5 shown in FIG. 10, the first connectors 105D may be located to overlap the source electrode 404S and the drain electrode 404D within the aperture 105B of the bank 105A in plan view, and the second connectors 105E may be located so as not to overlap the area between the source electrode 404S and the drain electrode 404D, i.e. not to overlap the channel area 507D.

In the TFT 500, the channel area 507D is not located on the source electrode 404S or the drain electrode 404D. Therefore, even when the semiconductor layer 507 has a slope near the first connectors 105D that overlap the source electrode 404S and the drain electrode 404D, such a slope does not have a large influence on the properties of the semiconductor layer 507. The effect of reducing the variations of the film thickness of the semiconductor layer 507 in the channel area 507D due to the first connectors 105D and the second connectors 105E of the aperture 105B is prominent, the stated configuration as a whole reduces the variations in the properties of the semiconductor layer 507 to some extent.

Note that the shape of the second connectors 105E, the shape of the first connectors 105D, the shape of the entirety of the aperture 105B, and the material and method of forming of the bank 105A of the present embodiment are the same as those corresponding to the bank 105A, the aperture 105B, the second connectors 105E and the first connectors 105D of the TFT 400 pertaining to Embodiment 4, except for the positional relationship of the second connectors 105E and the first connectors 105D relative to the source electrode 404S and the drain electrode 404D. In other words, the bank 105A of the present embodiment corresponds to the bank 105A of Embodiment 4 (and Embodiment 1) rotated by 90° clockwise (or counterclockwise). Therefore, configuration elements of the bank which are the same as in Embodiment 4 (and Embodiment 1) are labeled using the same reference signs. Similarly, the semiconductor layer 507 of the present embodiment corresponds to the semiconductor layer 407 of Embodiment 4 (and Embodiment 1) rotated by 90° clockwise (or counterclockwise) in plan view. However, since the positional relationship of the channel area relative to the first connectors and the second connectors is different, these elements are labeled using different reference signs. Note that the semiconductor layer 507 is the same as the semiconductor layer 407 (and the semiconductor layer 107) pertaining to Embodiment 4 (and Embodiment 1) in terms of the material and the method of forming.

Embodiment 6

In Embodiments 1 through 5 above, description is given to application of the present disclosure to a TFT as an example of an electronic device pertaining to one aspect of the present invention. However, an electronic device pertaining to one aspect of the present disclosure is not limited to a three-terminal transistor, and the present disclosure may be applied to two-terminal devices such as photo sensors and light-emitting elements. Embodiment 6 describes an example case where the present disclosure is applied to a light-emitting element as a two-terminal device.

Figure 11:
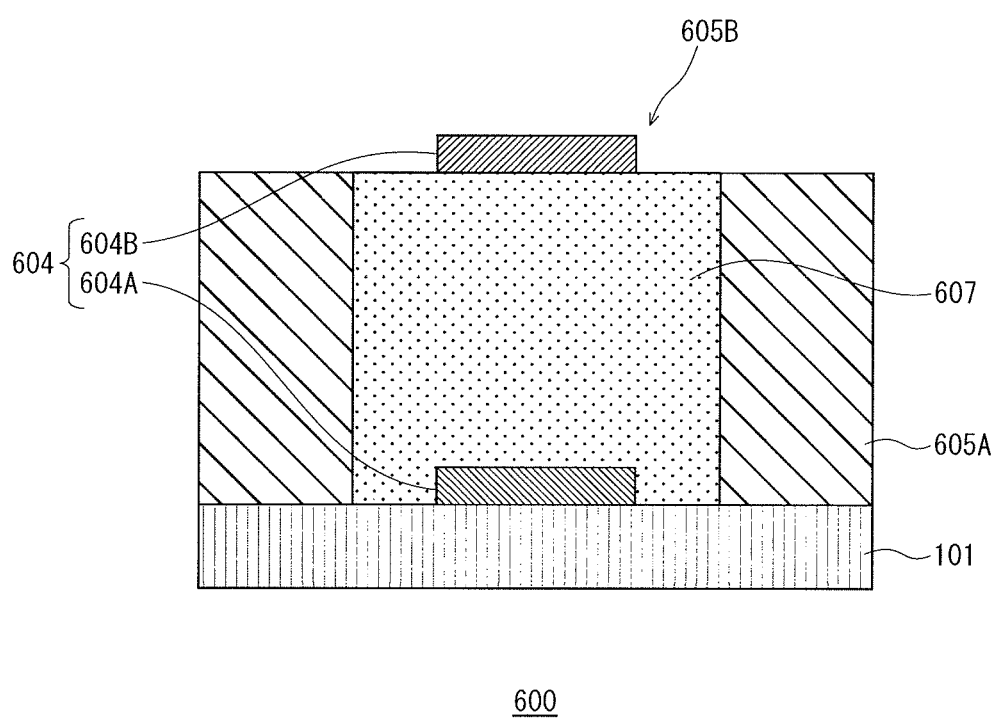
FIG. 11 is a schematic cross-sectional view illustrating a light-emitting element pertaining to Embodiment 6.

FIG. 11 is a schematic cross-sectional view illustrating a light-emitting element 600 pertaining to Embodiment 6. The light-emitting element 600 includes a substrate 101, a pair of electrodes 604, namely a lower electrode 604A and an upper electrode 604B, a bank 605A, and a semiconductor layer 607. The material, configuration and method of manufacturing of the lower electrode 604A and the upper electrode 604B are the same as the source electrode 104S and the drain electrode 104D pertaining to Embodiment 1. Also, the material and method of forming of the bank 605A and the method of forming of the aperture 605B are the same as the bank 105A and the aperture 105B pertaining to Embodiment 1.

The lower electrode 604A is disposed on the substrate 101, and the bank 605A is disposed on the substrate 101 such that the aperture 605B surrounds the lower electrode 604A. The semiconductor layer 607 is disposed within the aperture 605B, above the lower electrode 604A and the substrate 101. The upper electrode 604B is located above the portion of the semiconductor layer 607 above the lower electrode 604A. In other words, the lower electrode 604A and the upper electrode 604B are located above and below the semiconductor layer 607, with the semiconductor layer 607 interposed therebetween. The lower electrode 604A and the upper electrode 604B are both in contact with the semiconductor layer 607, and the lower electrode 604A and the upper electrode 604B are electrically connected to the semiconductor layer 607.

The semiconductor layer 607 includes organic or inorganic light-emitting material, and emits light when the upper electrode 604B and the lower electrode 604A are supplied with electric current. Known materials may be used as the light-emitting material in the semiconductor layer 607. For example, a fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of a 8-hydroxyquinoline compound, metal complex of a 2-bipyridine compound, complex of a Schiff base and a group three metal, metal complex of oxine, or rare earth metal complex. Furthermore, known phosphorescent materials that emit phosphorescent light such as Tris (2-phenylpyridine)iridium may be used.

In order to configure the light-emitting element 600 so as to emit light generated by the semiconductor layer 607 to the outside, at least one of the lower electrode 604A and the upper electrode 604B may contain a light-transmissive electrically-conductive material such as ITO (indium tin oxide), IZO (indium zinc oxide), or ZnO (zinc oxide).

In the light-emitting element 600 pertaining to the present embodiment, the aperture 605B of the bank 605A has the same shape in plan view as the aperture of the bank of the TFT pertaining to Embodiments 1 through 5. In other words, although not illustrated in FIG. 11, the aperture 605B has the first connector and the second connector. This configuration reduces the variations of the film thickness of the semiconductor layer 607 formed by drying the ink (in the present embodiment, the ink containing a light-emitting material) applied within the aperture 605B, thereby realizing preferable light-emitting properties.

Note that the semiconductor layer 607 may be a single layer, or have a laminate structure including a plurality of layers. When the semiconductor layer 607 includes a plurality of layers, it suffices if at least one of the layers contains a light-emitting material.

Embodiment 7

In Embodiments 1 through 5, description is given to application of the present disclosure to a TFT as an example of an electronic device pertaining to one aspect of the present invention. In Embodiment 6, description is given to application of the present disclosure to a light-emitting element as an example of an electronic device pertaining to one aspect of the present invention. However, the present invention is not limited to these examples.

In Embodiment 7, description is given to an organic EL display device as an example of a display device pertaining to another aspect of the present invention.

1. Overall Configuration of Organic EL Display Device

Figure 12:
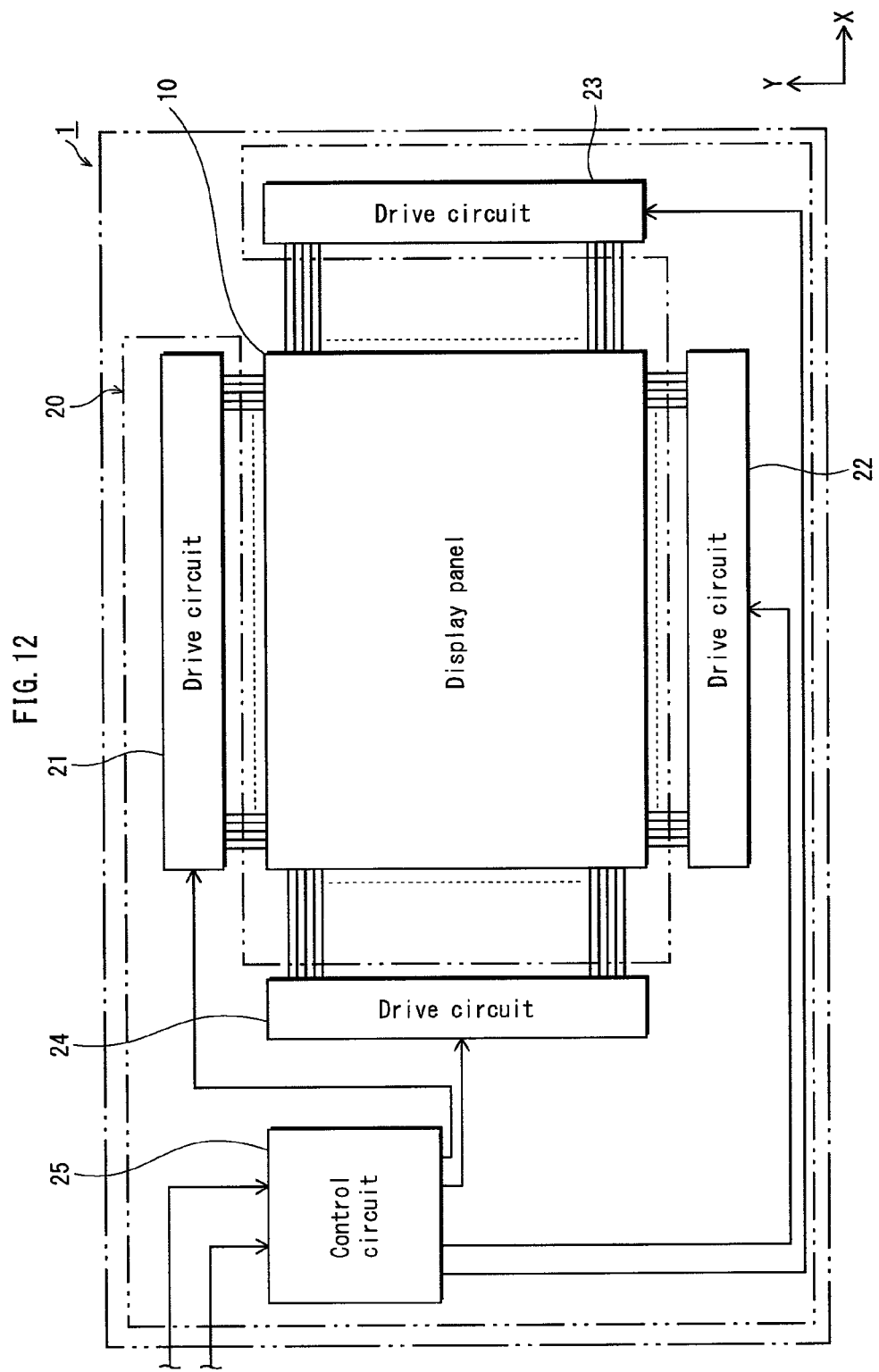
FIG. 12 is a schematic block diagram illustrating an overall configuration of an organic EL display device pertaining to Embodiment 7.

First, the overall configuration of the organic EL display device 1 pertaining to Embodiment 7 is described with reference to FIG. 12. As shown in FIG. 12, the organic EL display device 1 includes an organic EL display panel 10 and a drive controller circuit 20 connected thereto.

The organic EL display panel 10 is a panel that uses the phenomenon of electroluminescence occurring in organic material and is composed of an array of a plurality of organic EL elements, arranged in a matrix for example. The drive control circuit unit 20 is composed of four drive circuits 21 through 24 and a control circuit 25.

Note that in the organic EL display device 1 pertaining to the present embodiment, the arrangement of the drive control circuit unit 20 in relation to the organic EL display panel 10 is not limited to the arrangement shown in FIG. 12.

2. Configuration of Organic EL Display Panel

Next, the configuration of the organic EL display panel 10 is described with reference to FIG. 13.

Figure 13:
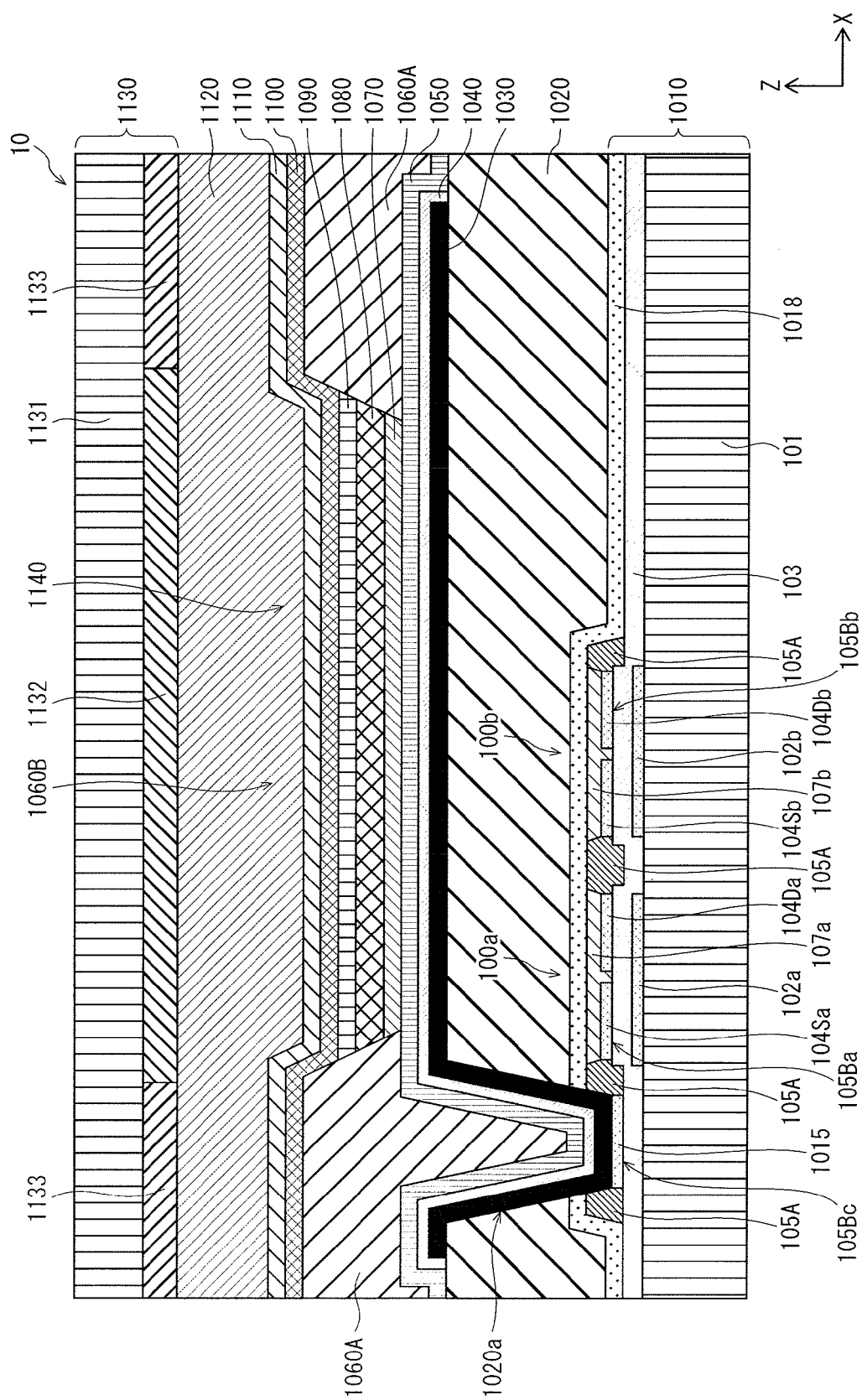
FIG. 13 is a schematic cross-sectional view illustrating a partial configuration of the organic EL display panel illustrated in FIG. 12.

FIG. 13 is a schematic cross-sectional view illustrating the configuration of the organic EL display panel 10. As shown in FIG. 13, the organic EL display panel 10 includes a TFT substrate 1010 having a plurality of TFT elements. The following explains the case where the TFT substrate 1010 has a plurality of TFTs 100 pertaining to Embodiment 1. Since the TFTs 100 and the TFT substrate 1010 are the same as those in Embodiment 1, explanation thereof is omitted here. Note that FIG. 13 shows a cross section of a part including two TFTs, namely TFT 100a and TFT 100b.

As shown in FIG. 13, the TFT substrate 1010 is coated with a planarizing film 1020. However, a contact hole 1020a is provided above the connection wiring 1015. The contact hole 1020a communicates with the aperture 105Bc in the TFT substrate 1010.

On the planarizing film 1020, an anode 1030, a light-transmissive electrically-conductive film 1040 and a hole injection layer 1050 are layered in the stated order. The anode 1030, the light-transmissive electrically-conductive film 1040 and the hole-injection layer 1050 are formed on the lateral surface of the planarizing film 1020 surrounding the contact hole 1020a. The anode 1030 is in contact with, and electrically connected to, the connection wiring 1015.

On the hole-injection layer 1050, a bank 1060A is formed to surround the area corresponding to a light-emitter (i.e. a sub-pixel) 1140. Within the aperture 1060B formed by being surrounded by the bank 1060A, a hole transporting layer 1070, an organic light-emitting layer 1080 and an electron transport layer 1090 are layered in the stated order.

Furthermore, a cathode 1100 and a sealing layer 1110 are layered in this order so as to cover the electron transport layer 1090 and the exposed surface of the bank 1060A. A color filter (CF) substrate 1130 is formed above the sealing layer 1110, and the CF and the sealing layer 1110 are joined together by an adhesive layer 1120 interposed therebetween. The CF substrate 1130 includes a substrate 1131, and a color filter 1132 and a black matrix 1133 which are formed on the lower main surface, in the Z-axis direction, of the substrate 1131.

The organic EL display panel 10 pertaining to the present embodiment reduces variations in the properties of the TFTs, thereby reducing variations in luminance of the light-emitters.

Although the organic EL display panel 10 of the organic EL display device 1 pertaining to the present embodiment includes a plurality of TFTs 100 pertaining to Embodiment 1, such a configuration is not essential. For example, any of the TFTs 100 through 500 respectively pertaining to Embodiments 1 through 5 may be used in the organic EL display panel 10. Furthermore, any combinations of these different types of TFTs may be used.

Furthermore, the light-emitter 1140 of the organic EL display panel 10 may have the same configuration as the light-emitting element 600 pertaining to Embodiment 6. If this is the case, the TFT substrate 1010 and the planarizing film 1020 correspond to the substrate 101, the anode 1030 and the light-transmissive electrically-conductive film 1040 correspond to the lower electrode 604A, and the cathode 1100 corresponds to the upper electrode 604B. The bank 1060A and the aperture 1060B correspond to the bank 605A and the aperture 605B, respectively. The hole-injection layer 1050, the hole transporting layer 1070, the organic light emitting layer 1080 and the electron transport layer 1090 correspond to the semiconductor layer 607. If this is the case, the layer containing the light-emitting material is the organic light-emitting layer 1080.

Modifications

Although the present invention has been explained above based on Embodiments 1 through 7, the present invention is not limited to these embodiments. The following modifications may be adopted. Note that configuration elements which are the same as in Embodiments 1 through 7 are labeled using the same reference signs and explanation thereof is omitted in order to avoid redundancies.

Modification 1

The TFTs 100 through 500 respectively pertaining to Embodiments 1 through 5 have a bottom gate device structure. However, this is not essential, and the same effects can be achieved even when the present disclosure is applied to a top gate configuration.

Modification 2

In Embodiment 6, explanation is provided as to the case where the present disclosure is applied to a light-emitting element. However, the present disclosure may be applied to a photo sensor.

Modification 3

In Embodiment 7, explanation is provided as to an organic EL display panel having a TFT substrate with a TFT pertaining to any of Embodiments 1 through 6. However, the present disclosure may be applied to a liquid-crystal display device having the above-described TFT substrate.

The electronic device and the electronic device manufacturing method pertaining to aspects of the present invention have been described above based on application to a TFT and a light-emitting element. However, the present invention is not limited to the above-described embodiments or modifications. The scope of the present invention includes any further modifications to the above-described embodiments and modifications that can be conceived of by a person skilled in the art, as well as any combinations of the constituent elements and functions of the above-described embodiments and modifications that do not depart from the spirit of the present invention.

INDUSTRIAL APPLICABILITY

An electronic device pertaining to the present disclosure is applicable broadly to display devices such as television sets, personal computers, mobile telephones, tablets, smartphones and signage, and other various electronic devices.

REFERENCE SIGNS LIST 101, 901 substrate
102, 102a, 102b gate electrode
104, 404, 604 a pair of electrodes
104S, 104Sa, 104Sb, 404S, 904S source electrode
104D, 104Da, 104Db, 404D, 904D drain electrode
105A, 205A, 305A, 505A, 605A, 905A bank
105B, 105Ba, 105Bb, 105Bc, 205B, 305B, 505B, 605B, 905B aperture
105C, 205C, 305C outline
105C1, 205C1, 305C1 first edge
105C1a, 205C1a, 305C1a first imaginary straight line
105C2, 205C2, 305C2 second edge
105C2a, 205C2a, 305C2a second imaginary straight line
105C3, 205C3, 305C3 third edge
105C3a, 205C3a, 305C3a third imaginary straight line
105D, 205D, 305D first connector
105D1, 205D1, 305D1 first connector region
105E, 205E, 305E second connector
105E1, 205E1, 305E1 second connector region
107, 107a, 107b, 207, 307, 607, 907 semiconductor layer
205F third connector
205F1 third connector region
205C4 fourth edge
205G fourth connector
908, 1018 protective layer
P1 first intersection point
P2 second intersection point

The invention claimed is:
1. An electronic device comprising:
a substrate;
a bank formed above the substrate;
a semiconductor layer formed within an aperture surrounded by the bank; and
a pair of electrodes electrically connected to the semiconductor layer, wherein
an outline of the aperture in plan view includes a first edge that is a straight line segment, a second edge that is a straight line segment continuous with one end of the first edge via a first connector, and a third edge that is a straight line segment continuous with the other end of the first edge via a second connector, and
the area of a first connector region differs from the area of a second connector region, the first connector region being defined by a first imaginary straight line extending along the first edge, a second imaginary straight line extending along the second edge, and the first connector, and the second connector region being defined by a third imaginary straight line extending along the third edge, the first imaginary straight line, and the second connector.

2. The electronic device of claim 1, wherein the first connector is a straight line segment.

3. The electronic device of claim 1, wherein the first connector is a curved line segment.

4. The electronic device of claim 2, wherein the second connector is a straight line segment.

5. The electronic device of claim 2, wherein the second connector is a curved line segment.

6. The electronic device of claim 1, wherein in plan view, a portion of the semiconductor layer between the pair of electrodes is separated from the outline.

7. The electronic device of claim 1, wherein a first intersection point, being an intersection of the first imaginary straight line and the second imaginary straight line, is located in the first connector or outside the outline, a second intersection point, being an intersection of the third imaginary straight line and the first imaginary straight line, is located outside the outline, and the area of the second connector region is greater than the area of the first connector region.

8. The electronic device of claim 7, wherein in plan view, a portion of the semiconductor layer between the pair of electrodes is separated from the first connector.

9. The electronic device of claim 7, wherein in plan view, the pair of electrodes do not overlap the first connector.

10. The electronic device of claim 7, wherein in plan view, at least one of the pair of electrodes overlaps the first connector.

11. The electronic device of claim 1, wherein the outline of the aperture in plan view additionally includes a fourth edge that is a straight line segment continuous with one end of the third edge via a third connector and with one end of the second edge via a fourth connector, said one end of the third edge being not connected to the second connector, and said one end of the second edge being not connected to the first connector, the area of a third connector region differs from the area of the second connector region, the third connector region being defined by a fourth imaginary straight line extending along the fourth edge, the third imaginary straight line, and the third connector, and the area of a fourth connector region differs from the area of the third connector region and the area of the first connector region, the fourth connector region being defined by the fourth imaginary straight line, the second imaginary straight line, and the fourth connector.

12. The electronic device of claim 1, wherein the semiconductor layer contains a material that performs photoelectric conversion.

13. The electronic device of claim 12, wherein the pair of electrodes are formed above and below the semiconductor layer, with the semiconductor layer interposed therebetween, and the semiconductor layer contains an organic or inorganic light-emitting material.

14. The electronic device of claim 1, further comprising:

a gate electrode formed between the substrate and the semiconductor layer, wherein the pair of electrodes are formed along a main surface of the substrate, with an interval therebetween, and a portion of the semiconductor layer is formed between the pair of electrodes, the pair of electrodes being composed of a source electrode and a drain electrode.

15. An electronic device manufacturing method comprising:

preparing a substrate;

forming a bank above the substrate;

applying ink within an aperture surrounded by the bank, thereby forming a semiconductor layer, the ink containing a semiconductor material; and forming a pair of electrodes electrically connected to the semiconductor layer, wherein an outline of the aperture in plan view includes a first edge that is a straight line segment, a second edge that is a straight line segment continuous with one end of the first edge via a first connector, and a third edge that is a straight line segment continuous with the other end of the first edge via a second connector, and the area of a first connector region differs from the area of a second connector region, the first connector region being defined by a first imaginary straight line extending along the first edge, a second imaginary straight line extending along the second edge, and the first connector, and the second connector region being defined by a third imaginary straight line extending along the third edge, the first imaginary straight line, and the second connector.

16. The electronic device manufacturing method of claim 15, wherein the ink contains an organic or inorganic light-emitting material, and the pair of electrodes are formed above the substrate and above and below the semiconductor layer, with the semiconductor layer interposed between the pair of electrodes.

17. The electronic device manufacturing method of claim 15, further comprising:

forming another electrode on the substrate; and forming an insulation layer between the semiconductor layer and the pair of electrodes, wherein the pair of electrodes are formed along a main surface of the substrate, with an interval therebetween, and a portion of the semiconductor layer is formed between the pair of electrodes.

\* \* \* \* \*